United States Patent
Wiseman et al.

(10) Patent No.: US 10,573,552 B2
(45) Date of Patent: Feb. 25, 2020

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Joseph W Wiseman, Austin, TX (US); Suraj K Patil, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/987,892

(22) Filed: May 23, 2018

(65) Prior Publication Data
US 2019/0287849 A1 Sep. 19, 2019

Related U.S. Application Data

(60) Provisional application No. 62/643,715, filed on Mar. 15, 2018.

(51) Int. Cl.
| | | |
|---|---|---|
| *H01L 21/768* | (2006.01) | |
| *H01L 29/66* | (2006.01) | |
| *H01L 29/06* | (2006.01) | |
| *H01L 29/78* | (2006.01) | |

(52) U.S. Cl.
CPC .. *H01L 21/76834* (2013.01); *H01L 29/66795* (2013.01); *H01L 29/0649* (2013.01); *H01L 29/785* (2013.01)

(58) Field of Classification Search
CPC ......... H01L 21/76834; H01L 29/66795; H01L 29/785; H01L 29/0649
USPC ....... 438/197, 239, 294, 299, 586, 619, 787; 257/288, 365, 344, 347, 355, 382, 408, 257/529, E21.129, E21.151, E21.19, 257/E21.409, E21.581, E21.585, E23.011, 257/E23.144, E23.155, E27.016, E27.02, 257/E29.255, E29.271, E29.278, E29.296
See application file for complete search history.

(56) References Cited

U.S. PATENT DOCUMENTS

| | | | |
|---|---|---|---|
| 6,627,532 B1 | 9/2003 | Gaillard et al. | |
| 8,841,711 B1 * | 9/2014 | Cai .................. | H01L 29/401 257/288 |
| 8,847,401 B2 * | 9/2014 | Chen ................. | H01L 23/5222 257/249 |
| 8,895,379 B2 | 11/2014 | Cheng et al. | |
| 9,041,151 B2 | 5/2015 | Lavoie et al. | |
| 9,608,065 B1 * | 3/2017 | Bergendahl ........ | H01L 27/0886 |
| 9,911,824 B2 * | 3/2018 | Ching ................ | H01L 29/6656 |

(Continued)

FOREIGN PATENT DOCUMENTS

KR 100948298 B1 3/2010

*Primary Examiner* — Dao H Nguyen
(74) *Attorney, Agent, or Firm* — Renaissance IP Law Group LLP

(57) ABSTRACT

A semiconductor device includes a gate electrode disposed on a fin, a gate spacer disposed on the fin and a sidewall of the gate electrode, a source/drain electrode disposed on the fin, and an air pocket structure interposed between the gate spacer and the source/drain electrode. The air pocket structure includes an air gap, a first sidewall, a top sealing, a second sidewall and a bottom sealing. The air gap is enclosed by the first sidewall, the top sealing, the second sidewall and the bottom sealing arranged in a clockwise sequence. The top sealing and the bottom sealing include the same material of an energy removable material.

11 Claims, 30 Drawing Sheets

(56) References Cited

U.S. PATENT DOCUMENTS

| | | | |
|---|---|---|---|
| 10,008,578 B1* | 6/2018 | Lee | H01L 29/78 |
| 10,121,700 B2* | 11/2018 | Li | H01L 21/02164 |
| 2007/0037411 A1 | 2/2007 | Balkenende et al. | |
| 2007/0178713 A1* | 8/2007 | Jeng | H01L 21/76814 |
| | | | 438/787 |
| 2012/0119302 A1 | 5/2012 | Pei et al. | |
| 2012/0153500 A1* | 6/2012 | Kim | H01L 21/7682 |
| | | | 257/774 |
| 2012/0299088 A1 | 11/2012 | Heineck et al. | |
| 2013/0248950 A1* | 9/2013 | Kang | H01L 29/78 |
| | | | 257/288 |
| 2016/0247805 A1* | 8/2016 | Basker | H01L 21/823814 |
| 2017/0170290 A1 | 6/2017 | Basker et al. | |
| 2017/0338329 A1* | 11/2017 | Pei | H01L 29/66795 |
| 2018/0090593 A1* | 3/2018 | Cheng | H01L 23/535 |

* cited by examiner

APS-UP

APS-MP

APS-LP

S130B — Forming Energy Removable Layer in Trench

S130C — Forming Second Low-L Dielectric Layer on Energy Removable Layer

SEMICONDUCTOR DEVICE AND METHOD OF FABRICATING THE SAME

CROSS-REFERENCE TO RELATED APPLICATION

This application claims the priority of U.S. Provisional Application No. 62/643,715 filed on Mar. 15, 2018, the disclosure of which is incorporated herein by reference in its entirety.

TECHNICAL FIELD

The present inventive concept relates to a semiconductor device and a method of fabricating the same.

DISCUSSION OF RELATED ART

Semiconductor devices include transistors, contacts and interconnects. The transistors may be formed on the bottom of the semiconductor devices and serve as switches. The interconnects may be formed on the top of the transistors as wirings that transfer electrical signals from one transistor to another. As the interconnects become more compact at each node, an unwanted resistance-capacitance (RC) delay in chips increases. The interconnects in multi-level may be connected to each other using a series of contact structures. The contact resistance and corresponding parasitic capacitances associated with the contact structures increases the RC delay.

SUMMARY

According to an exemplary embodiment of the present inventive concept, a semiconductor device includes a gate electrode disposed on a fin, a gate spacer disposed on the fin and a sidewall of the gate electrode, a source/drain electrode disposed on the fin, and an air pocket structure interposed between the gate spacer and the source/drain electrode. The air pocket structure includes an air gap, a first sidewall, a top sealing, a second sidewall and a bottom sealing. The air gap is enclosed by the first sidewall, the top sealing, the second sidewall and the bottom sealing arranged in a clockwise sequence. The top sealing and the bottom sealing include the same material of an energy removable material.

According to an exemplary embodiment of the present inventive concept, a method of fabricating a semiconductor device is provided as follows. A gate structure is formed on a fin, wherein the gate structure includes a first gate spacer, a second gate spacer, and a gate electrode interposed therebetween. A source/drain contact is formed on the fin. A source/drain electrode is formed on the source/drain contact. An air pocket pattern is formed between the source/drain contact and the gate electrode. The air pocket pattern includes a first low-k dielectric pattern and an energy removable pattern between the gate structure and the source/drain electrode. An air gap is formed by applying energy to the energy removable pattern. The air gap is defined in part by the first low-k dielectric pattern.

According to an exemplary embodiment of the present inventive concept, a method of forming a trench silicide contact is provided as follows. One or more layers are perforated to create a perforation exposing at least a portion of a silicon substrate. A first material is deposited through the perforation, the first material including a first metal that is reactive with silicon. The silicon substrate is annealed to form a silicide in the exposed portion of the silicon substrate. The first material is removed from sidewalls of the layers. A liner material is deposited onto the sidewalls of the layers, the liner material having a lower dielectric constant than that of silicon dioxide and including an energy removal porous material. A second material is deposited through the perforation, the deposited second material being in electrical contact with the silicide.

BRIEF DESCRIPTION OF DRAWINGS

These and other features of the present inventive concept will become more apparent by describing in detail exemplary embodiments thereof with reference to the accompanying drawings of which:

FIG. 9 shows step S130 of FIG. 6 in detail according to an exemplary embodiment of the present inventive concept;

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein.

Figure 1:
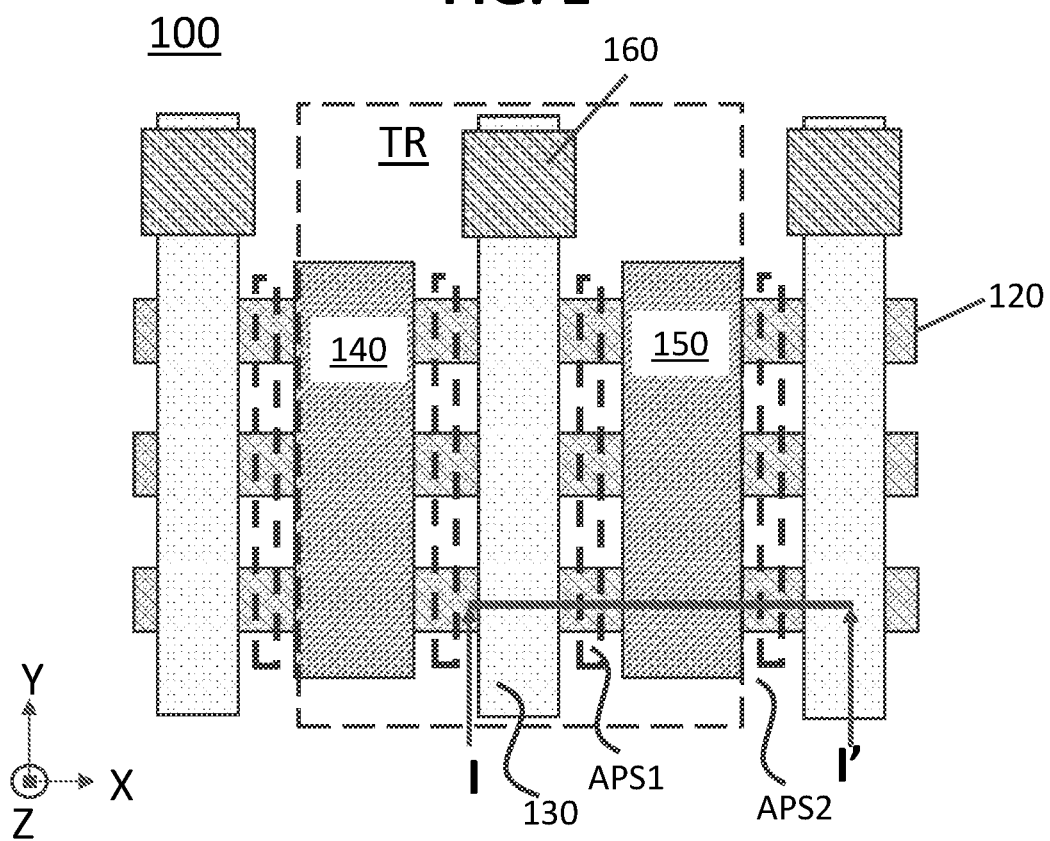
FIG. 1 shows a layout of a semiconductor device according to an exemplary embodiment of the present inventive concept.
Figure 2A:
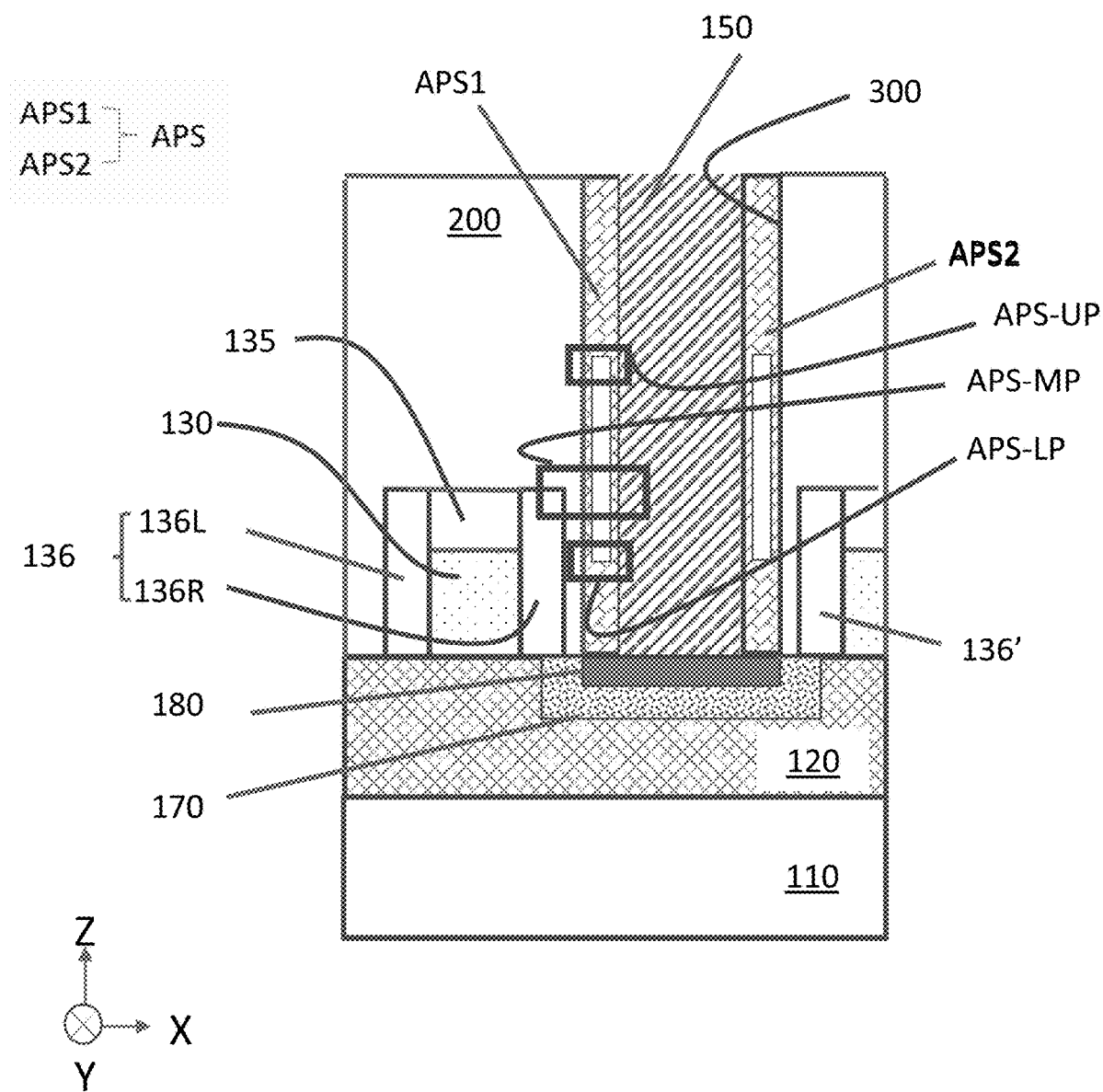
FIG. 2A shows a cross-sectional view taken along line I-I' of FIG. 1 according to an exemplary embodiment of the present inventive concept.
Figure 2B:
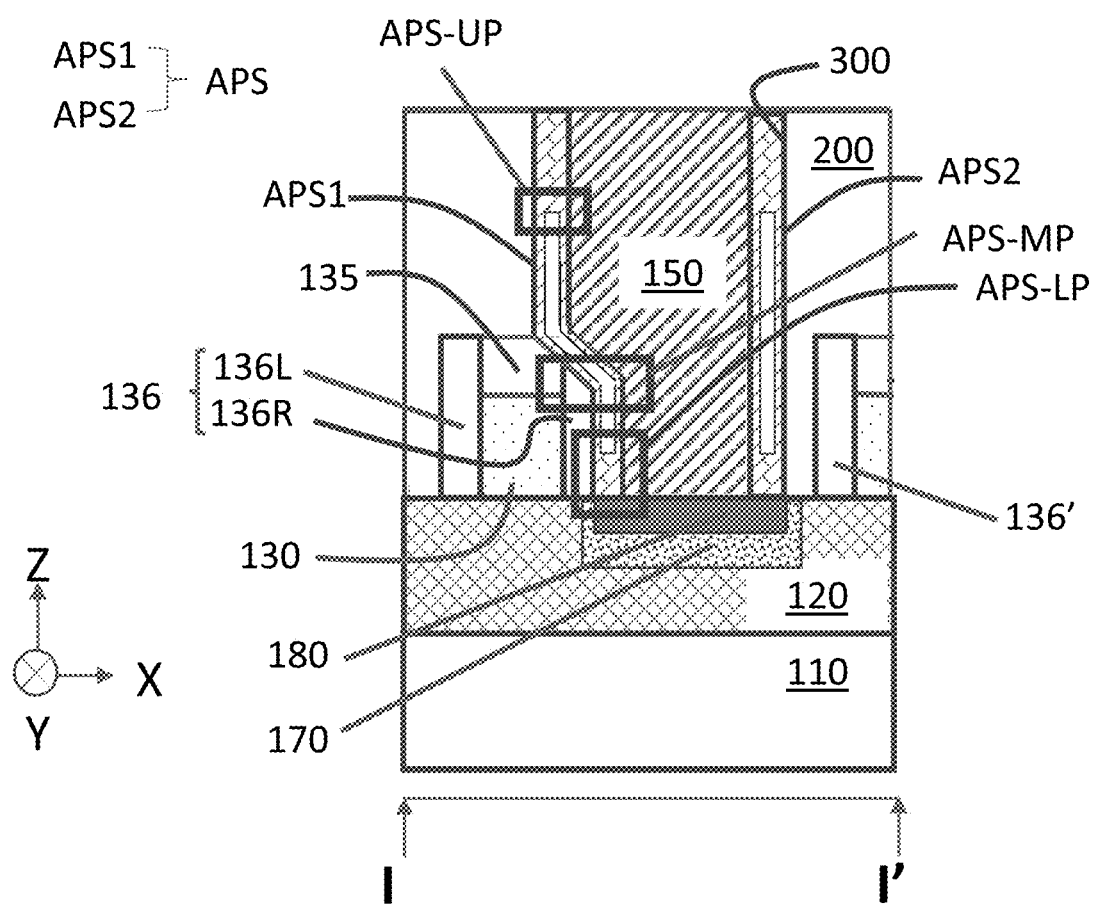
FIG. 2B shows a cross-sectional view taken along line I-I' of FIG. 1 according to an exemplary embodiment of the present inventive concept.

Hereinafter, a semiconductor device including an air pocket structure between a gate spacer of a gate electrode and a source/drain electrode will be described with reference to FIGS. 1, 2A and 2B. The air pocket structure, according to the inventive concept, may reduce a coupling capacitance between the gate electrode and the source/drain so that an RC delay of middle-of-line (MOL) integration is reduced. The MOL integration may be formed of various contacts including a source/drain contact connected in series between the front-end-of-the-line (FEOL) and the backend-of-the-line (BEOL) of the semiconductor device. FIG. 1 shows a layout of a semiconductor device according to an exemplary embodiment of the present inventive concept. FIG. 2A shows a cross-sectional view taken along line I-I' of FIG. 1 according to an exemplary embodiment of the present inventive concept. FIG. 2B shows a cross-sectional view taken along line I-I' of FIG. 1 according to an exemplary embodiment of the present inventive concept.

In FIGS. 1, 2A and 2B, a semiconductor device 100 includes a transistor TR formed on a substrate 110 and an interlayer dielectric layer 200 covering the transistor TR.

The transistor TR includes a plurality of fins 120, a gate electrode 130, a first source/drain electrode 140, a second source/drain electrode 150 and a gate contact electrode 160. The transistor TR further includes a hard mask layer 135 and a gate spacer 136. The gate spacer 136 includes a first gate spacer 136L and a second gate spacer 136R. The transistor TR further includes a source/drain region 170 and a source/drain contact 180. The transistor TR further includes an air pocket structure APS having a first air pocket structure APS1 and a second air pocket structure APS2. The interlayer dielectric layer 200 is disposed on the gate electrode 130 to cover the gate electrode 130. The second source/drain electrode 150 and the air pocket structure APS are disposed in a trench 300. The second source/drain electrode 150 may be in contact with the source/drain contact 180. The air pocket structure APS may also be in contact with the source/drain contact 180.

The substrate 110 may include silicon, germanium (Ge) or silicon-germanium (SiGe) alloy. The substrate 110 may also include a compound semiconductor such as silicon carbide (SiC), gallium arsenic (GaAs), indium arsenide (InAs), and indium phosphide (INS). Furthermore, the substrate 110 nay include a semiconductor-on-insulator (SOI) structure. For example, the substrate 110 may include a buried oxide (BOX) layer formed by using a process such as separation by implanted oxygen (SIMOX).

The fins 120 may provide an active region for the transistor TR in which a channel is formed according to a voltage applied to the gate electrode 130. Each of the fins 120 is extended along a first direction X. The fins 120 are spaced apart from each other along a second direction Y crossing the first direction X. Each of the fins 120 protrudes from the substrate 110 in a third direction Z that is perpendicular to the layout of FIG. 1. In an exemplary embodiment, the fins 120 may be formed by partially etching the substrate 110. In an exemplary embodiment, the fins 120 may be epitaxially formed on the substrate 110.

For the convenience of description, the fins 120 include three fins. The present inventive concept is not limited thereto. For example, the number of the fins 120 may be less than 3 or more than 3.

In an exemplary embodiment, the transistor TR may include a plurality of nanowires instead of the fins 120 to provide an active region with the transistor.

The gate electrode 130 is extended in the second direction Y. The gate electrode 130 may include metal such as tungsten (W), cobalt (Co), aluminum (Al). For example, the gate electrode 130 may be formed by using a replacement-metal-gate (RMG) process. In an exemplary embodiment, the gate electrode 130 may include doped poly-silicon.

The hard mask layer 135 is formed on a top surface of the gate electrode 130. The hard mask layer 135 may serve to protect the gate electrode 130 when the trench 300 is formed to expose parts of the fins 120. For example, when a photomask for forming the trench 300 is shifted toward the second gate spacer 136R, the second gate spacer 136R and/or the hard mask layer 135 may be exposed to an etching gas used in the formation of the trench 300. With etch selectivity with respect to the interlayer dielectric layer 200, the hard mask layer 135 and the gate spacer 136R may serve to protect the gate electrode 130. For example, when the interlayer dielectric layer 200 includes silicon oxide, the hard mask layer 135 and the gate spacer 136R may include silicon nitride. In this case, as shown in FIG. 2B, the first gate spacer 136L and the second gate spacer 136R may have different shapes due to spacer loss of the second gate spacer 136R. For example, the second gate spacer 136R is shorter than the first gate spacer 136L.

The gate spacer 136 is disposed on either side of the gate electrode 130. The gate spacer 136 is further disposed on either side of the hard mask layer 135. The gate spacer 136 may serve to electrically isolate the gate electrode 130 from other conductive elements (e.g. the second source/drain electrode 150). For example, the gate spacer 136 may include silicon nitride, silicon carbon nitride, silicon oxy nitride. The gate spacer 136 and/or the hard mask layer 135 may be subject to an etching process when the trench 300 is formed, which may cause to remove partly the gate spacer 136 and/or the hard mask layer 135. In this case, the first gate spacer 136L, left to the gate electrode 130, and the second gate spacer 136R, right to the gate electrode 130, have different shapes. According to an exemplary embodiment, the air gap structure APS may be formed after the formation of the gate spacer 136 and the formation of the trench 300, and thus, the loss of the second gate spacer 136R in the process of forming the trench 300 need not affect the air gap structure APS.

The first source/drain electrode 140 and the second source/drain electrode 150 may be substantially the same in structure and material. The first source/drain electrode 140 is disposed on one side of the gate electrode 130, and the second source/drain electrode 150 is disposed on the other side of the gate electrode 130. For the convenience of description, the second source/drain electrode 150 will be described in detail, which may apply to the first source/drain electrode 140.

The second source/drain electrode 150 is disposed between the gate electrode 130 and a gate spacer 136' of another transistor adjacent to the transistor TR. The second source/drain electrode 150 may be shared by the transistor TR and its adjacent transistor in the first direction X. As shown in the layout of FIG. 1 and the cross-sectional view of FIG. 2A, the second source/drain electrode 150 is disposed in the middle between the gate electrode 130 and a gate electrode of another transistor adjacent to the transistor TR. However, due to a process variation such as a shift of photomask for defining a region to be formed as the trench 300 on the interlayer dielectric layer 200, the second source/drain electrode 150 may be shifted toward the second gate spacer 136R as shown in FIG. 2B, for example. The second source/drain electrode 150 may be self-aligned to the source/drain contact 180 through the trench 300. The second source/drain electrode 150 overlaps partly the second gate spacer 136R. In an exemplary embodiment, the second source/drain electrode 150 may overlap partly the hard mask layer 135.

The second source/drain electrode 150 may be formed of metal including tungsten (W), copper (Cu), cobalt (Co), ruthenium (Ru) or molybdenum (Mo).

The gate contact electrode 160 is disposed on the gate electrode 130. For example, the gate contact electrode 160 is disposed on one end of the gate electrode 130 so that the gate contact electrode 160 is not disposed between two gate electrodes adjacent to each other along the first direction X. The gate contact electrode 160 is non-overlapped with the fins 120 in the third direction Z. The gate contact electrode 160 may be electrically connected to the gate electrode 130. The present inventive concept is not limited thereto. For example, the gate contact electrode 160 may be disposed between two adjacent gate electrodes. In this case, the gate contact electrode 160 may overlap the fins 120 in the third direction Z.

The source/drain region 170 is formed in the fins 120. In an exemplary embodiment, the source/drain region 170 may be a raised source/drain region formed on the fins 120 using an epitaxial growth method. The raised source/drain region may be partly disposed along a sidewall of the gate spacer 136. In the epitaxial growth method, the fins 120 may serve as a seed layer. The source/drain region 170 may include silicon doped with dopants or a silicon germanium alloy doped with dopants.

The source/drain contact 180 is formed on the source/drain region 170. The source/drain contact 180 may include metal silicide such as titanium silicide, nickel silicide, nickel platinum silicide, tantalum silicide and cobalt silicide. The source/drain contact 180 may serve to reduce contact resistance between the source/drain region 170 and the second source/drain electrode 150.

The first air pocket structure APS1 is formed on a left inner sidewall of the trench 300 and a top surface of the source/drain contact 180. For example, the first air pocket structure APS1 is in contact with the left inner sidewall of the trench 300 and the top surface of the source/drain contact 180. The first air pocket structure APS1 is interposed between the second source/drain electrode 150 and the second gate spacer 136R.

The second air pocket structure APS2 is formed on a right inner sidewall of the trench 300 and the top surface of the source/drain contact 180. For example, the second air pocket structure APS2 is in contact with the right inner sidewall of the trench 300 and the top surface of the source/drain contact 180. The second air pocket structure APS2 is interposed between the second source/drain electrode 150 and the interlayer dielectric layer 200 covering the gate spacer 136' of a transistor adjacent to the transistor TR in the first direction X.

The first air pocket structure APS1 and the second air pocket structure APS2 may have the same structure and material. In FIG. 2A, the source/drain electrode 150 is formed in a non-self-aligned contact, and the first air pocket structure APS1 and the second air pocket structure APS2 may have the same shape. In FIG. 2B, the source/drain electrode 150 is formed in a self-aligned contact, and the first air pocket structure APS1 and the second air pocket structure APS2 may have different shapes. For example, the first air pocket structure APS1 has a curved part adjacent to a corner of the gate electrode 130, and the second air pocket structure APS2 is straight along the third direction Z. The present inventive concept is not limited thereto. For example, the second air pocket structure APS2 may be curved adjacent to a corner of a gate electrode of another transistor, depending on a width of the second source/drain electrode 150 and the degree of photomask shift in the formation of the trench 300.

Figure 3A:
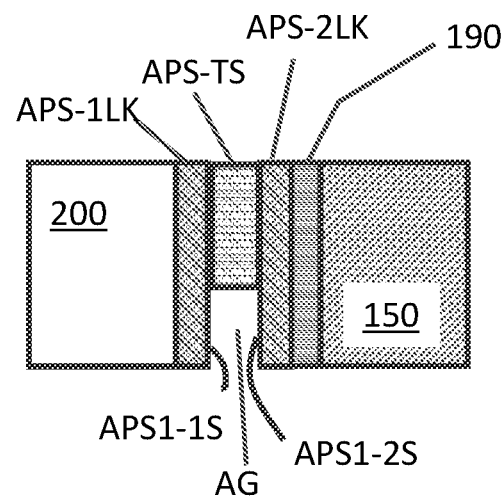
FIG. 3A shows an upper part of a first air pocket structure in FIG. 2B according to an exemplary embodiment of the present inventive concept.
Figure 3B:
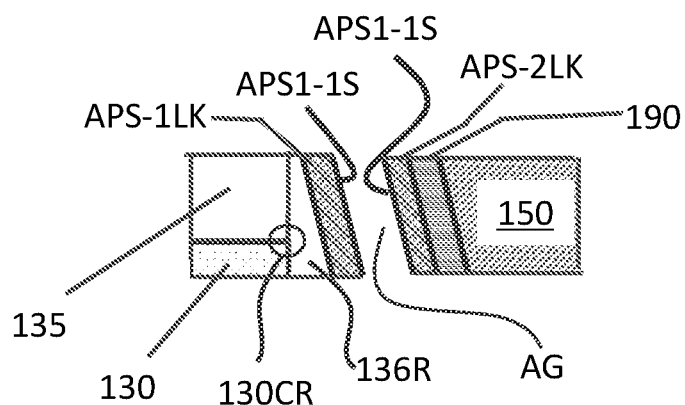
FIG. 3B shows a middle part of the first air pocket structure in FIG. 2B according to an exemplary embodiment of the present inventive concept.
Figure 3C:
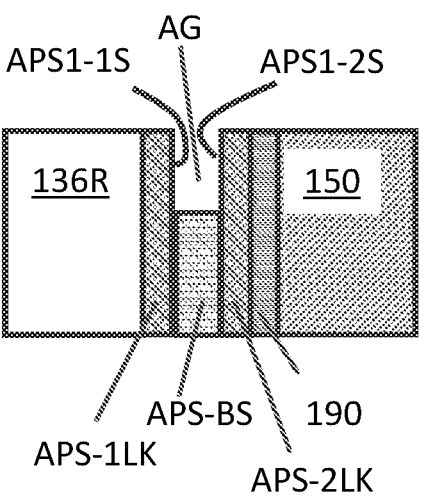
FIG. 3C shows a lower part of the first air pocket structure in FIG. 2B according to an exemplary embodiment of the present inventive concept.

Hereinafter, the first air pocket structure APS1 of FIGS. 2B will be described with reference to FIGS. 3A to 3C, which may apply to the second air pocket structure APS2. FIG. 3A shows an upper part APS-UP of the first air pocket structure APS1 in FIGS. 2B according to an exemplary embodiment of the present inventive concept; FIG. 3B shows a middle part APS-MP of the first air pocket structure APS1 in FIGS. 2B according to an exemplary embodiment of the present inventive concept; and FIG. 3C shows a lower part APS-LP of the air pocket structure in FIG. 2B according to an exemplary embodiment of the present inventive concept. The upper part APS-UP and the lower part APS-LP of FIGS. 2A may have the same cross-sectional view as shown in FIGS. 3A and 3B. However, the middle part APS-MP of FIGS. 2A and 2B may be different. The difference will be described with reference to FIG. 3B.

The first air pocket structure APS1 includes a first sidewall APS1-1S, a top sealing APS-TS, a second sidewall APS1-2S, a bottom sealing APS-BS and an air gap AG disposed therebetween. For example, the air gap AG is enclosed by the first sidewall APS1-1S, the top sealing APS-TS, the second sidewall APS1-2S and the bottom sealing APS-BS that are arranged around the air gap AG in a clockwise sequence. In an exemplary embodiment, the air gap AG may be filled with air of which a dielectric constant is about unity (1).

The first sidewall APS1-1S is defined by a first low-k dielectric pattern APS-1LK. The second sidewall APS-2S is defined by a second low-k dielectric pattern APS-2LK. The first low-k dielectric pattern APS-1LK may include a low-k dielectric material having atoms of Si, C, O, B, P, N or H. For example, the dielectric constant for the first low-k dielectric pattern is from about 2.4 to about 3.5 depending upon the mole fraction of Si, C, N, B, P, H and O. The second low-k dielectric pattern APS-2LK may include the same material as that of the first low-k dielectric pattern APS-1LK. In this case, the air gap AG is interposed between the first low-k dielectric pattern APS-1LK and the second low-k dielectric pattern APS-2LK. For example, the first low-k dielectric pattern APS-1LK, the air gap AG and the second low-k dielectric pattern APS-2LK are laminated along the first direction X as listed. A nitride liner 190 is disposed between the second low-k dielectric pattern APS-2LK and the second source/drain electrode 150. In an exemplary embodiment, the nitride liner 190 may include a conformal titanium nitride (TiN) that is conductive. The nitride liner 190 may serve as a protective layer of its underlying structure (e.g., the source/drain contact 180) in the formation of the second source/drain electrode 150. The nitride liner 190 may also serve as an adhesive layer between the second source/drain electrode 150 and the source/drain contact 180.

The top sealing APS-TS, in FIG. 3A, is interposed between the first low-k dielectric pattern APS-1LK and the second low-k dielectric pattern APS-2LK. In an exemplary embodiment, the top sealing APS-TS may be in contact with the first low-k dielectric pattern APS-1LK at its one side and the second low-k dielectric pattern APS-2LK at its opposite side.

In FIG. 3A, the first low-k dielectric pattern APS-1LK is interposed between the interlayer dielectric layer 200 and the top sealing APS-TS. In an exemplary embodiment, the first low-k dielectric pattern APS-1LK may be in contact with the interlayer dielectric layer 200 at its one side and the top sealing APS-TS at its opposite side.

The second low-k dielectric pattern APS-2LK is interposed between the top sealing APS-TS and the nitride liner 190. In an exemplary embodiment, the second low-k dielectric pattern APS-2LK may be in contact with the top sealing APS-TS at its one side and the nitride liner 190 at its opposite side.

In FIG. 3C, the bottom sealing APS-BS is interposed between the first low-k dielectric pattern APS-1LK and the second low-k dielectric pattern APS-2LK. In an exemplary embodiment, the bottom sealing APS-BS may be in contact with the first low-k dielectric pattern APS-1LK at its one side and the second low-k dielectric pattern APS-2LK at its opposite side.

The first low-k dielectric pattern APS-1LK is interposed between the second gate spacer 136R and the bottom sealing APS-BS. In an exemplary embodiment, the first low-k dielectric pattern APS-1LK may be in contact with the second gate spacer 136R at its one side and the bottom sealing APS-BS at its opposite side.

The second low-k dielectric pattern APS-2LK is interposed between the nitride liner 190 and the bottom sealing APS-BS. In an exemplary embodiment, the second low-k dielectric pattern APS-2LK may be in contact with the nitride liner at its one side and the bottom sealing APS-BS at its opposite side.

In an exemplary embodiment, the top sealing APS-TS and the bottom sealing APS-BS may include substantially the same material such as an energy removable material. The energy removable material may include a material such as a thermal decomposable material, a photonic decomposable material, an e-beam decomposable material and a combination thereof.

For example, the energy removable material may include a matrix material and a decomposable porogen material that is sacrificially removed upon being exposed to an energy source. The energy source may include heat, light or a combination thereof. The matrix material may include a methylsilsesquioxane (MSQ) based material, and the decomposable porogen material may include a porogen organic compound that provides porosity to the matrix material of the energy removable material. A heat or light treatment may remove the decomposable porogen material from the energy removable material to generate pores, with the matrix material remaining in place. Air may fill the pores made after the decomposable porogen material was removed. In this case, the air gap of the first air pocket structure APS1 may be highly porous such that the pores are connected to each other.

In an exemplary embodiment, the energy removable material may include a relatively high concentration of the porogen material and a relatively low concentration of the matrix material. For example, the energy removable material may include about 55% or greater of the porogen material, and about 45% or less of the matrix material. In an exemplary embodiment, the energy removable material may include about 75% or greater of the porogen material, and about 25% or less of the matrix material. In an exemplary embodiment, the energy removable material may include 100% of the decomposable porogen material, and no matrix material is used. In this case, no matrix material may be present in the air gap AG of the first air pocket structure APS1 after a heat or light treatment is performed.

The present inventive concept is not limited thereto. For example, the first air pocket structure APS1 may include one of the top sealing APS-TS and the bottom sealing APS-BS. Where the first air pocket structure APS1 includes the top sealing APS-TS only, part of the substrate (e.g., part of the source/drain contact 180) may serve to seal the air gap AG with the top sealing APS-TS, the first sidewall APS1-1S and the second sidewall APS-2S. For the first air pocket structure APS1 having the bottom sealing APS-BS only, a sealing layer may be disposed on the interlayer dielectric layer 200 and the second source/drain electrode 150 to seal the air gap AG with the bottom sealing APS-BS, the first sidewall APS1-1S and the second sidewall APS-2S.

In FIG. 3B like FIGS. 3A and 3C, the air gap AG is interposed between the first low-k dielectric pattern APS-1LK and the second low-k dielectric pattern APS-2LK. However, the first low-k dielectric pattern APS-1LK is interposed between the air gap AG and the second gate spacer 136R. In this case, the second gate spacer 136R is adjacent to the second source/drain electrode 150 at the shortest distance in the first direction X with the air gap AG therebetween. Near a corner 130CR of the gate electrode 130, the second gate spacer 136R and the second source/drain electrode 150 may have the shortest distance in the first direction X. When the second gate spacer 136R includes silicon nitride of which a dielectric constant is about 7.5, a coupling capacitance between the gate electrode 130 and the second source/drain electrode 150 arranged at the shortest distance may be such that without the air gap AG according to the present inventive concept, the second source/drain electrode 150 may increase its signal delay, which may be detrimental to the operation of a high-speed transistor. The air gap AG between the first low-k dielectric pattern APS-1LK and the second low-k dielectric pattern APS-2LK may reduce an equivalent dielectric constant of the first air pocket structure APS1 to be smaller than that of the first low-k dielectric pattern APS-1LK, for example. Depending on a relative thickness of the air gap AG to the first low-k dielectric pattern APS-1LK (assuming that the first low-k dielectric pattern APS-1LK has substantially the same thickness as that of the second low-k dielectric pattern APS-2LK), the equivalent dielectric constant of the first air pocket structure APS1 may have a value between a dielectric constant (about one (1)) of air and that of a low-k dielectric material included in the first low-k dielectric pattern APS-1LK.

In an exemplary embodiment, the first low-k dielectric pattern APS-1LK and the second low-k dielectric pattern APS-2LK may have a mechanical strength sufficient to support the first air pocket structure APS1 having the air gap AG at the inside thereof or to prevent the first air pocket structure APS1 from collapsing into the air gap AG.

In FIG. 2A, the second gate spacer 136R may be the same shape as the first gate spacer 136L. For example, the trench 300 may be formed without gate spacer loss unlike FIGS. 2B and 3B. In this case, the interlayer dielectric layer 200 may be disposed between the second gate spacer 136R and the first air pocket structure APS1.

In FIGS. 3A to 3C, the first air pocket structure APS1 includes the first low-k dielectric pattern APS-1LK and the second low-k dielectric pattern APS-2LK as a template to define the air gap AG therebetween. In this case, the air gap AG is enclosed by the first low-k dielectric pattern APS-1LK, the top sealing APS-TS, the second low-k dielectric pattern APS-2LK and the bottom sealing APS-BS that are arranged around the air gap AG in a clockwise sequence. The present inventive concept is not limited thereto. For example, an air pocket structure may include, instead of having two low-k dielectric patterns as its template, one low-k dielectric pattern and another constituent elements of the transistor TR such as the second gate spacer 136R and the nitride liner 190, as shown in FIGS. 4 and 5.

Figure 4:
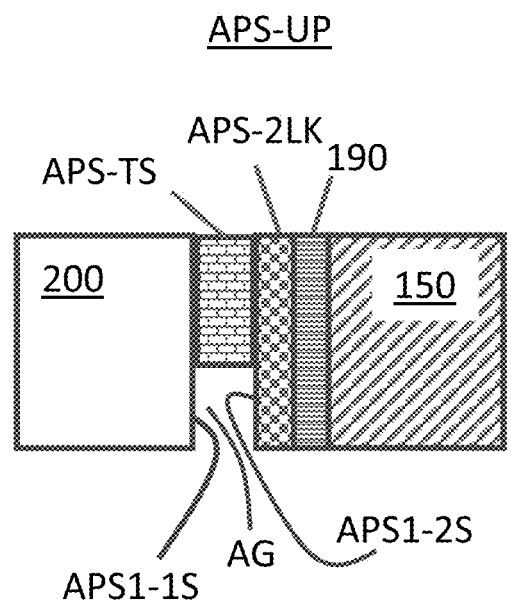
FIG. 4 shows an upper part and a lower part of a first air pocket structure in FIG. 2B according to an exemplary embodiment of the present inventive concept.

FIG. 4 shows an upper part APS-UP and a lower part APS-LP of the first air pocket structure APS1 in FIGS. 2A and 2B according to an exemplary embodiment of the present inventive concept. FIG. 5 shows an upper part APS-UP and a lower part APS-LP of the first air pocket structure APS1 in FIGS. 2A and 2B according to an exemplary embodiment of the present inventive concept. In FIGS. 4 and 5, the middle part APS-MP of the first air pocket structure APS1 in FIGS. 2A and 2B will not be shown. The middle part AMPS-MP of the first air pocket structure APS1 in FIGS. 4 and 5 may be substantially the same as that of the first air pocket structure APS1 in FIG. 3B, except that the first air pocket structure in FIGS. 4 and 5 includes one low-k dielectric pattern only.

In FIG. 4, the first air pocket structure APS1 includes the first sidewall APS1-1S defined by the interlayer dielectric layer 200 at the upper part APS-UP and defined by the second gate spacer 136R at the lower part APS-LP. The first air pocket structure APS1 also includes the second sidewall APS1-2S defined by the second low-k dielectric pattern APS-2LK. In this case, the first air pocket structure APS1 includes the air gap AG enclosed by the second gate spacer 136R, the interlayer dielectric layer 200, the top sealing APS-TS, the second low-k dielectric pattern APS-2LK and the bottom sealing APS-BS that are arranged around the air gap AG in a clockwise sequence. In an exemplary embodiment where part of the hard mask layer 135 is exposed in the middle part APS-MP, the air gap AG may be enclosed by the second gate spacer 136R, the part of the hard mask layer 135, the interlayer dielectric layer 200, the top sealing APS-TS, the second low-k dielectric pattern APS-2LK and the bottom sealing APS-BS that are arranged around the air gap AG in a clockwise sequence. The second low-k dielectric pattern APS-2LK may be formed of a low-k dielectric material including various combinations of atoms such as Si, C, B, C, N, P, O and H. SiCOH is one such example). The dielectric constant for SiCOH is from about 2.4 to about 3.5 depending upon the mole fraction of Si, C and O.

Figure 5:
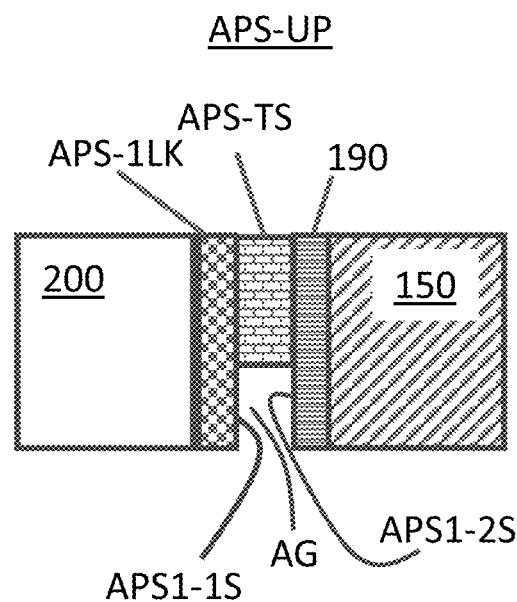
FIG. 5 shows an upper part and a lower part of a first air pocket structure in FIG. 2B according to an exemplary embodiment of the present inventive concept.
Figure 5:
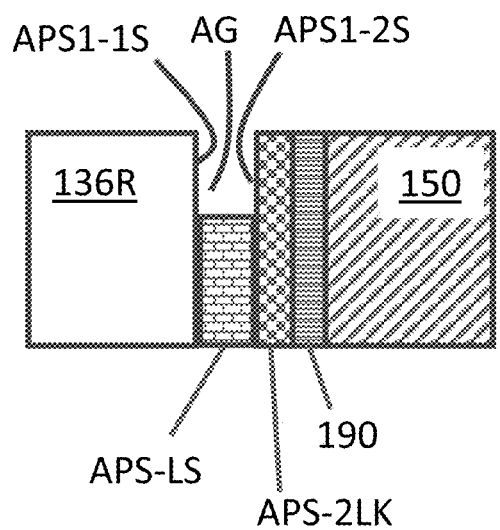
Figure 5:
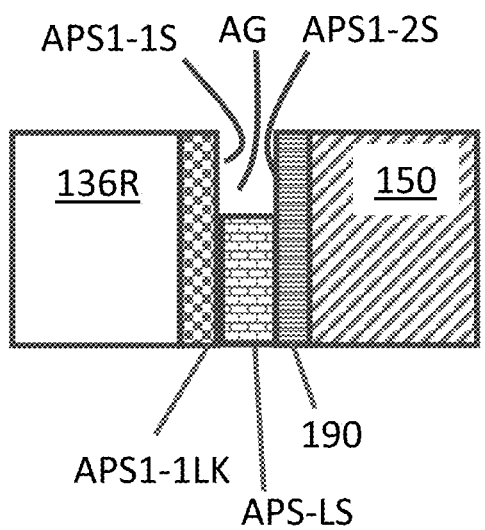

In FIG. 5, the first air pocket structure APS1 includes the first sidewall APS1-1S defined by the first low-k dielectric pattern APS-1LK and the second sidewall APS1-2S defined by the nitride liner 190. In this case, the first air pocket structure APS1 includes an air gap AG enclosed by the first low-k dielectric pattern APS-1LK, the top sealing APS-TS, the nitride liner 190 and the bottom sealing APS-BS that are arranged around the gap in a clockwise sequence. The first low-k dielectric pattern APS-1LK may be formed of a low-k dielectric material including atoms such as Si, C, B, C, N, P, O and H. The dielectric constant for SiCOH, for example, is from about 2.4 to about 3.5 depending upon the mole fraction of Si, C and O.

Hereinafter, it will be described about a fabrication process of forming the semiconductor device 100 of FIG. 1 with the first air pocket structure APS1 of FIGS. 3A to 3C. The fabrication process will be described with reference to FIGS. 1, 3A to 3C, 6, 7 and 8A to 8H.

Figure 6:
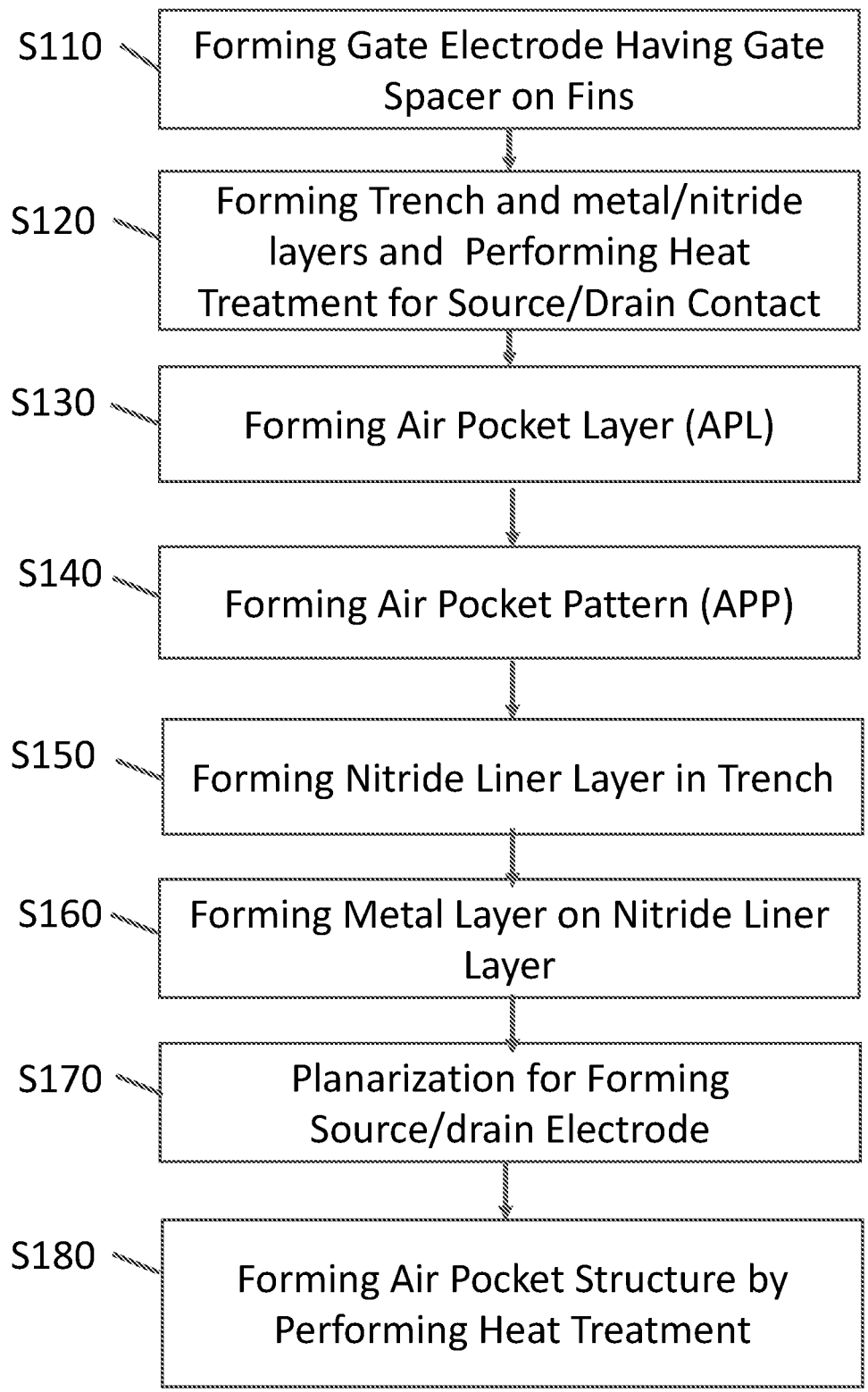
FIG. 6 is a flowchart showing fabrication process steps of forming the semiconductor device of FIG. 1 according to an exemplary embodiment of the present inventive concept.
Figure 7:
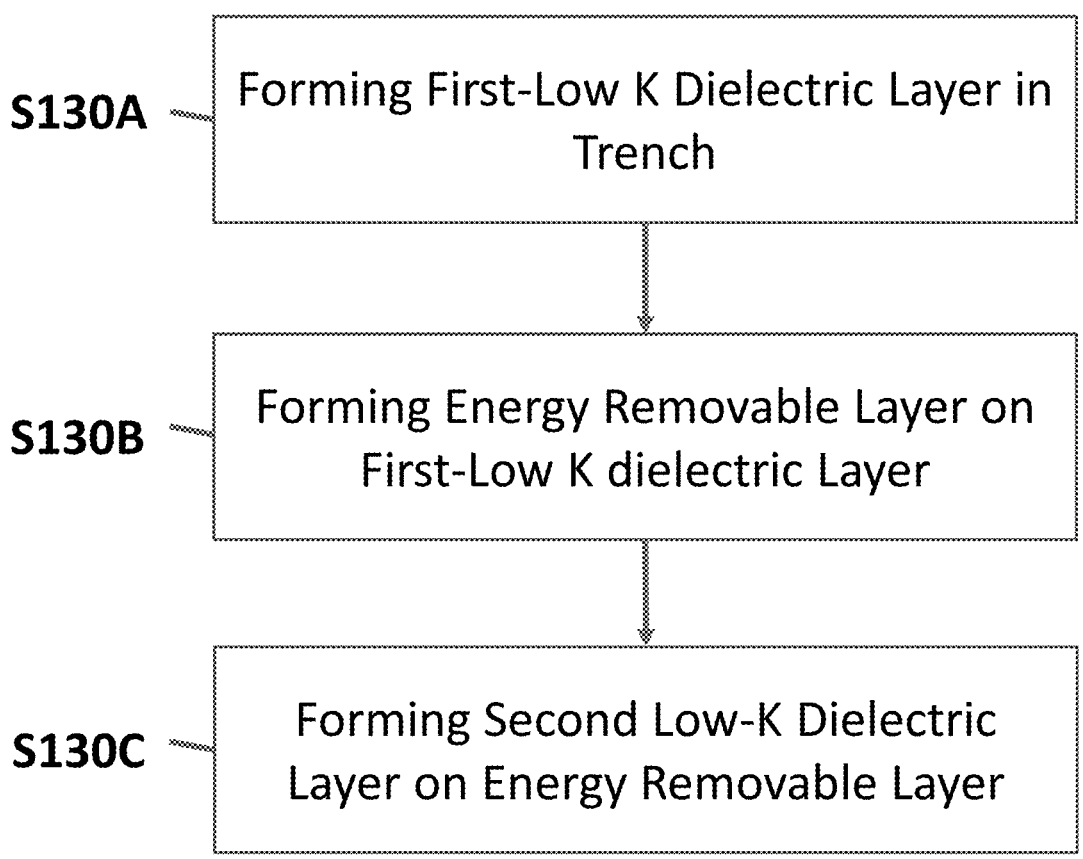
FIG. 7 shows step S130 of FIG. 6 in detail according to an exemplary embodiment of the present inventive concept.

FIG. 6 is a flowchart showing fabrication process steps of forming the semiconductor device 100 according to an exemplary embodiment of the present inventive concept; FIG. 7 shows step S130 of FIG. 6 in detail according to an exemplary embodiment of the present inventive concept; and FIGS. 8A to 8H show step-by-step, cross-sectional views, taken along line I-I' of FIG. 1, of the semiconductor device 100 formed by using the exemplary fabrication process steps of FIGS. 6 and 7 according to the present inventive concept.

Figure 8A:
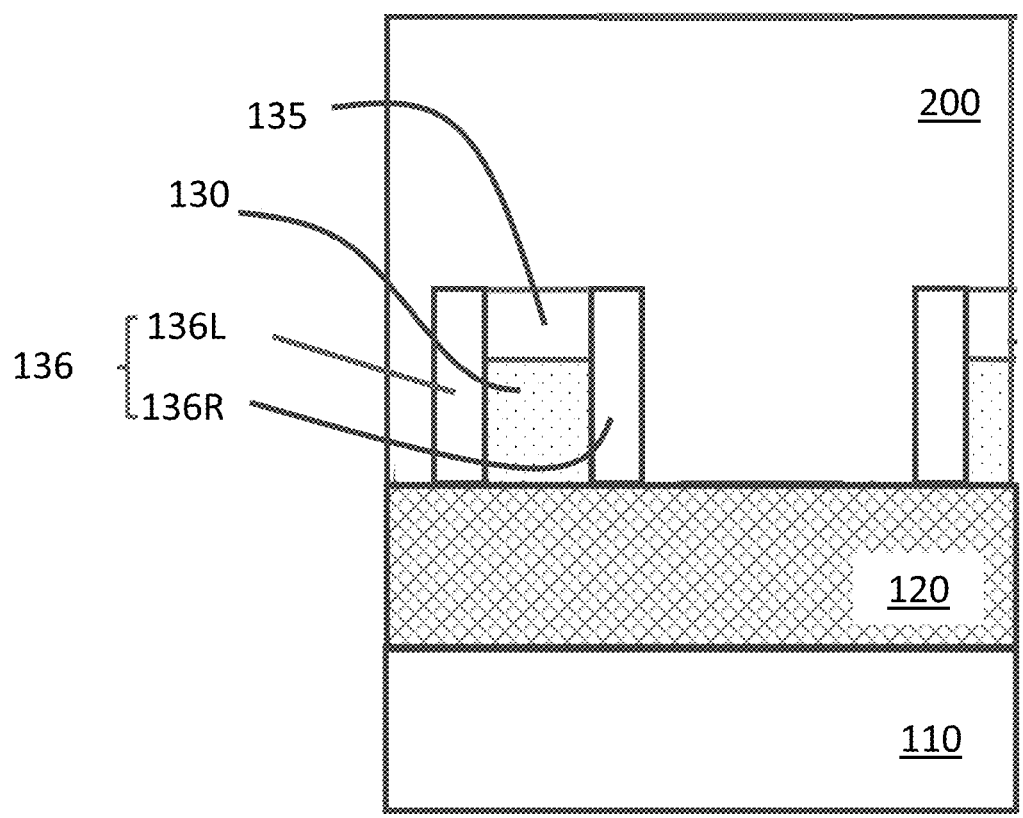
FIGS. 8A, 8B, 8C, 8D, 8E, 8F, 8G and 8H show step-by-step, cross-sectional views, taken along line I-I' of FIG. 1, of the semiconductor device formed by using the exemplary fabrication process steps of FIGS. 6 and 7 according to the present inventive concept.

In FIG. 8A, the gate electrode 130 and the interlayer dielectric layer 200 are formed on the fins 120 according to step S110 of FIG. 6. The gate electrode 130 has a top surface covered with the hard mask layer 135, sidewalls covered with the gate spacer 136 having the first gate spacer 136L and the second gate spacer 136R. The first gate spacer 136L and the second gate spacer 136R also cover sidewalls of the hard mask layer 135. The interlayer dielectric layer 200 covers the hard mask layer 135, the gate spacer 136 and the fins 120.

The gate spacer 136 and the hard mask layer 135 may include an insulating material having etch selectivity with respect to that of the interlayer dielectric layer 200. For example, when the interlayer dielectric layer 200 includes silicon oxide, the gate spacer 136 and the hard mask layer 135 may include silicon nitride or silicon oxynitride. In an exemplary embodiment, the gate spacer 136 and the hard mask layer 135 may include the same material or different materials.

The hard mask layer 135, the gate spacer 136 and the gate electrode 130 may be formed in a replacement-metal-gate (RMG) process in which the gate spacer 136 may serve as a template for forming the gate electrode 130. For example, a sacrificial layer may be formed in a region defined by the first gate spacer 136L and the second gate spacer 136R, and then the sacrificial layer may be replaced with the gate electrode 130 topped with the hard mask layer 135. In an exemplary embodiment, the gate electrode 130 may include metal such as tungsten (W).

In an exemplary embodiment, when the transistor TR of FIG. 1 has a raised source/drain region, an epitaxial layer may be formed, before the interlayer dielectric layer 200 is formed, on the fins 120 between the gate electrode 130 and its adjacent gate electrode.

Figure 8B:
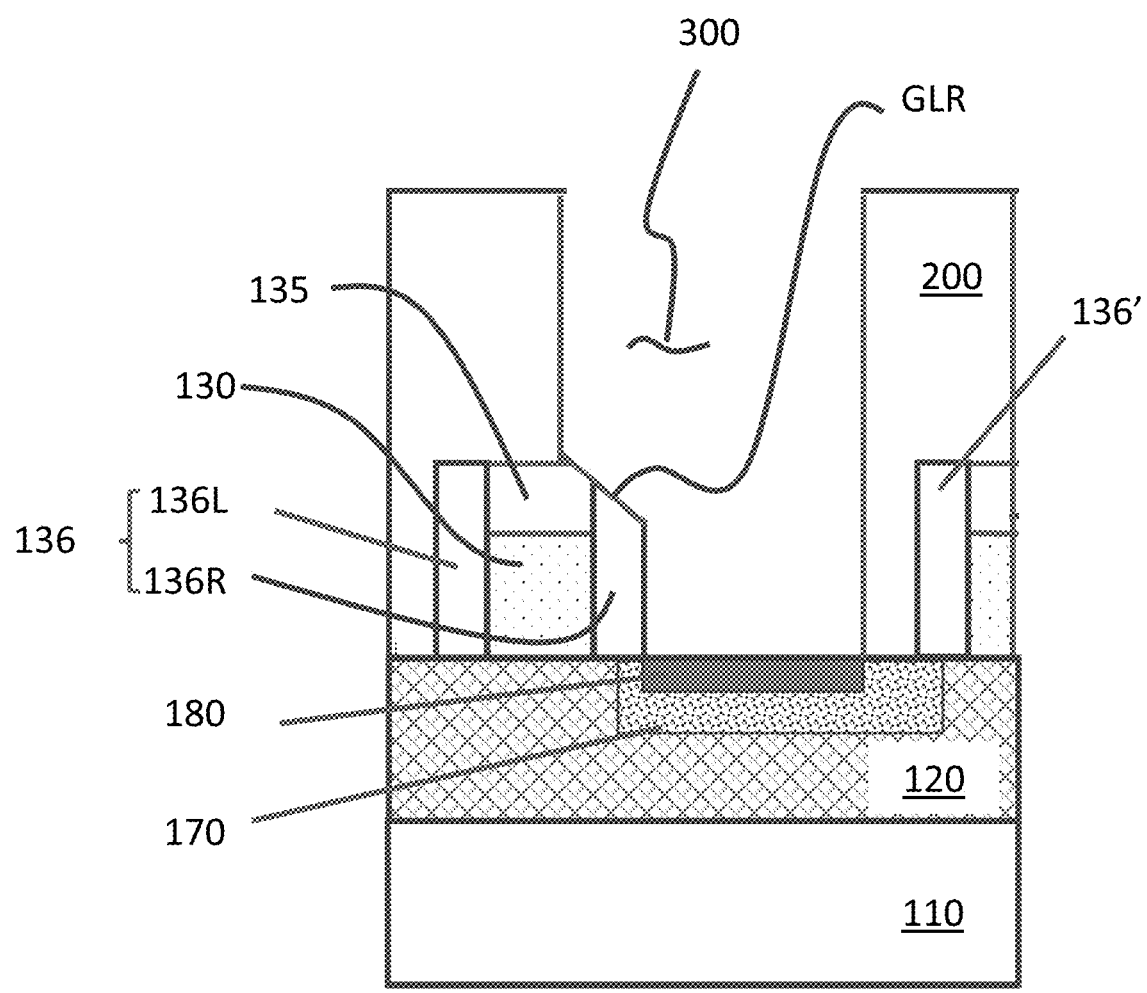

In FIG. 8B, the trench 300 is formed, according to step S120, in the interlayer dielectric layer 200 using a reactive ion etching (RIE) process to expose the fins 120 between the gate electrode 130 and its adjacent gate electrode. Through the trench 300, the source/drain region 170 and the source/drain contact 180 are formed in the fins 120. To form the source/drain region 170, dopants may be doped into the fins 120 through the trench 300. For example, an ion implantation process or a diffusion process may be performed to form the source/drain region 170 in the fins 120.

A photomask for defining the trench 300 on a region of the interlayer dielectric layer 200 may be shifted toward the second gate spacer 136R as described with reference to FIGS. 1 and 2B. However, the process for forming the trench 300 may be controlled such that the trench 300 is formed without removing partially the second gate spacer 136R. For the convenience of description, it is assumed that the photomask is shifted toward the second gate spacer 136R. In this case, the second gate spacer 136R may be subject to an RIE process for forming the trench 300, which may remove partially the second gate spacer 136R, thereby forming a gate-spacer-loss region GLR at a corner of the second gate spacer 136R. In this case, the second gate spacer 136R having the gate-spacer-loss region GLR are different from the first gate spacer 136L in shape after the formation of the trench 300. The hard mask layer 135 may also be removed partially depending on the degree of the photomask shift.

The present inventive concept is not limited thereto. For example, depending on the degree of the photomask shift and the width of the trench 300, another gate spacer 136' may also be partially removed in the RIE process in the formation of the trench 300.

To form the source/drain contact 180, a dual layer of a metal layer and a nitride layer may be formed on the fins 120 through the trench 300 and then a heat treatment process may apply to the dual layer. The metal layer including titanium (Ti) may be in contact with the source/drain region 170, and the nitride layer including titanium nitride (TiN) may be in contact with the metal layer. In an exemplary embodiment, the metal layer may be formed using a physical vapor deposition process such as a sputtering process. The nitride layer may be formed conformally in the trench 300 using a chemical vapor deposition (CVD) process or an atomic layer deposition (ALD) process.

In the heat treatment process, metal atoms (titanium atoms, for example) of the metal layer may react chemically with Si atoms of the fins 120 to form the source/drain contact 180 (e.g., titanium silicide) in the source/drain region 170. The present inventive concept is not limited thereto. For example, the source/drain contact 180 may include cobalt silicide. In this case, the metal layer including cobalt (Co) may be formed on the fins 120 through the trench 300 using a PVD process, and then cobalt atoms may react with silicon atom of the fins 120 to form cobalt silicide as the source/drain contact 180.

In an exemplary embodiment, the heat treatment process may be performed using a dynamic surface annealing process to form the source/drain contact 180. The dynamic surface annealing may cause a shallow-depth region of the source/drain region 170 to reach a silicidation temperature. In the heat treatment, part of the metal layer and the nitride layer may remain unreacted. Before performing the subsequent process, the unreacted part of the metal layer and the nitride layer may be removed by using an etchant such as $H_2O_2$ and a SC-1 solution. This enables deposition of a relatively thinner adhesion nitride layer (TiN) followed by metal fill. Thinner barrier and more metal results in lower contact resistance.

Figure 8C:
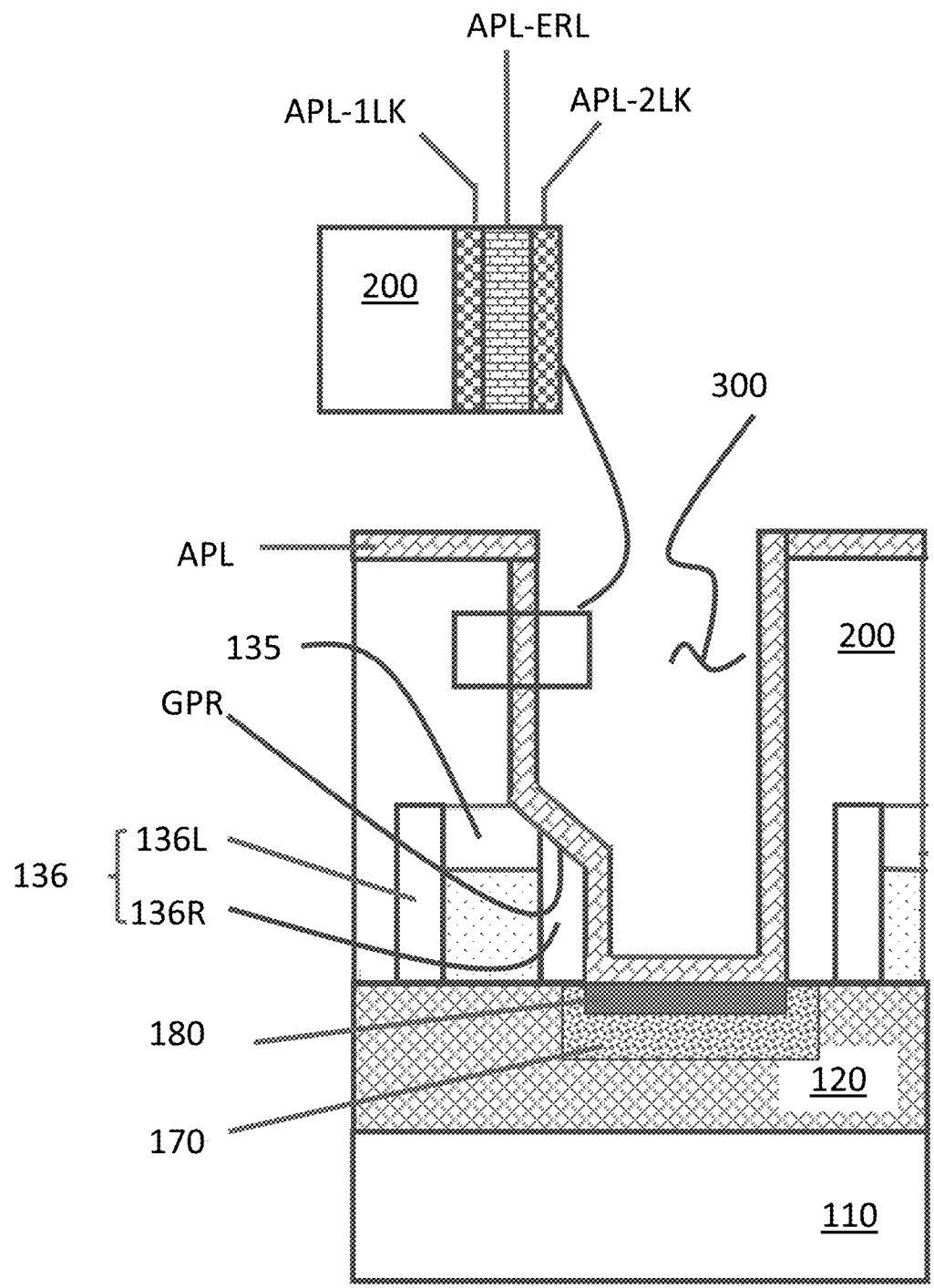

In FIG. 8C, an air pocket layer APL is formed on the resulting structure of FIG. 8B according to step S130 of FIGS. 6 and 7. For example, the air pocket layer APL may be conformally formed, using a CVD process, on a top surface of the interlayer dielectric layer 200, a sidewall of the trench 300 and the source/drain contact 180. The sidewall of the trench 300 may be defined by a sidewall of the interlayer dielectric layer 200, the gate-spacer-loss region GPR, and a sidewall of the second gate spacer 136R. In an exemplary embodiment, the air pocket layer APL may be in contact with the second gate spacer 136R with the gate-spacer-loss region GPR. In an exemplary embodiment, the air pocket layer APL may be in contact with the source/drain contact 180.

The air pocket layer APL includes a first low-k dielectric layer APL-1LK, a second low-k dielectric layer APL-2LK and an energy removable layer APL-ERL interposed therebetween. The first low-k dielectric layer APL-1LK may be formed, using a CVD process, on the resulting structure of FIG. 8B according to step S130A of FIGS. 6 and 7. In step S130B, the energy removable layer APL-ERL may be formed, using a CVD process, on the first low-k dielectric layer APL-1LK. In step S130C, the second low-k dielectric layer APL-2LK may be formed, using a CVD process, on the energy removable layer APL-ERL.

The first low-k dielectric layer APL-1LK may include a low-k dielectric material having atoms such as Si, C, O, B, P, N and H. The detailed description of SiCOH, for example, was made above with reference to the first low-k dielectric pattern APS-1LK. The detailed description thereof will be omitted. The second low-k dielectric layer APL-2LK may have substantially the same material as the first low-k dielectric layer APL-1LK.

The energy removable layer APL-ERL may include a material such as a thermal decomposable material, a photonic decomposable material, an e-beam decomposable material, and a combination thereof. The detailed description of the material was made above with reference to the top sealing APS-TS, and thus the detailed description thereof will be omitted.

Figure 8D:
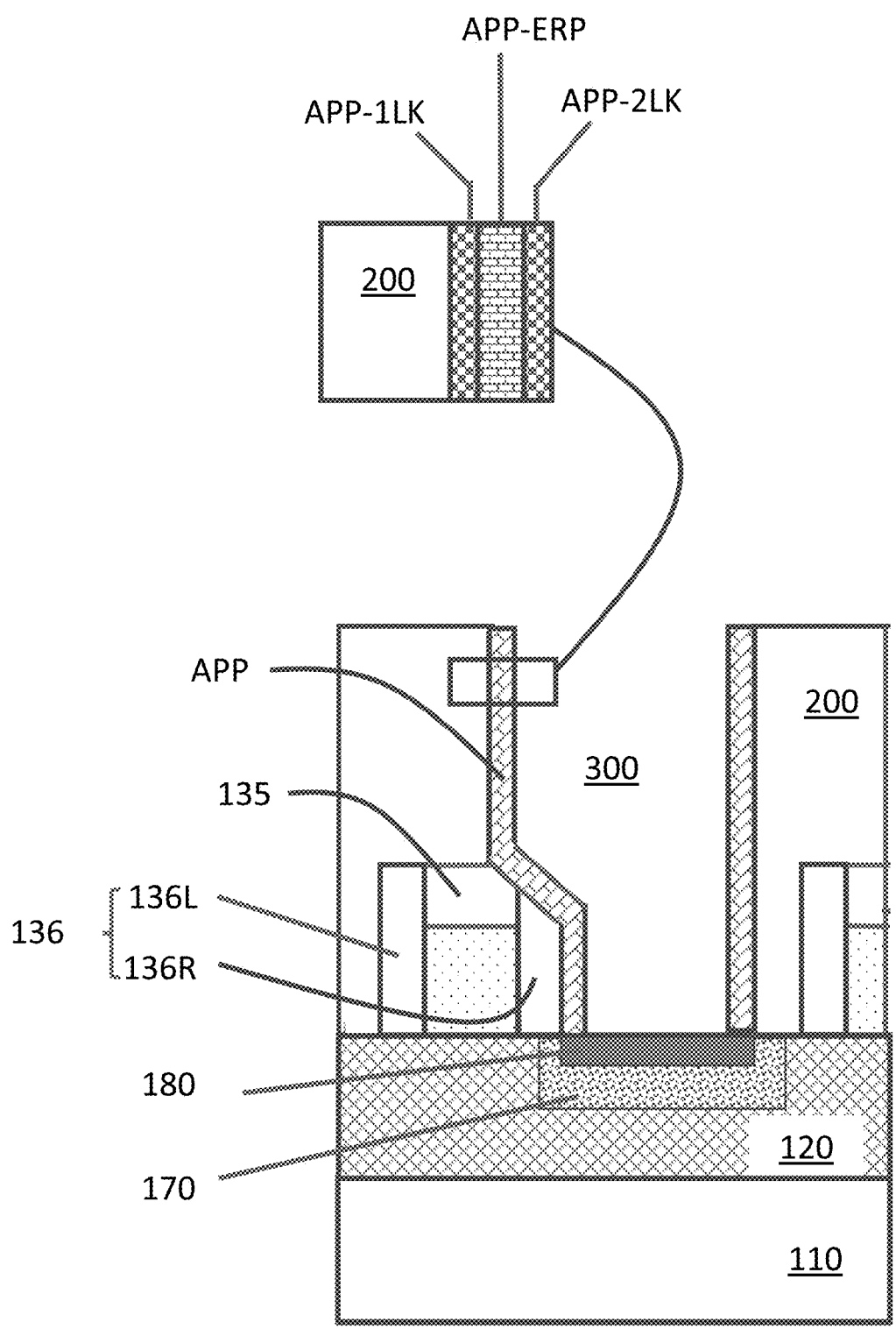

In FIG. 8D, an air pocket pattern APP is formed from the air pocket layer APL of FIG. 8C according to step S140 of FIG. 6. A reactive ion etching (RIE) process may be performed on the resulting structure of FIG. 8C. In the reactive ion etching, the air pocket layer APL formed on a top surface of the interlayer dielectric layer 200 and on the source/drain contact 180 may be removed; and the air pocket layer APL on a sidewall of the interlayer dielectric layer 200 within the trench 300 (or on a sidewall of the trench 300) may remain or may be barely removed to form the air pocket pattern APP. The slope of the gate-spacer-loss region GPR of the second gate spacer 136R is exaggerated for the convenience of description. The slope of the gate-spacer-loss region GPR may be such that the second low-k dielectric layer APL-LK2 of FIG. 8C is barely removed in the RIE process to form the air pocket pattern APP.

The air pocket pattern APP includes a first low-k dielectric pattern APP-1LK, a second low-k dielectric pattern APP-2LK and an energy removable pattern APP-ERP. The first low-k dielectric pattern APP-1LK and the second low-k dielectric pattern APP-2LK may remain in place in the subsequent process, thereby serving as a template to form the air gap AG. In the completed structure of the air pocket structure APP of FIGS. 3A to 3C, the first low-k dielectric pattern APP-1LK was referred to using "APS-1LK," and the second low-k dielectric pattern APP-2LK was referred to using "APS-2LK."

Figure 8E:
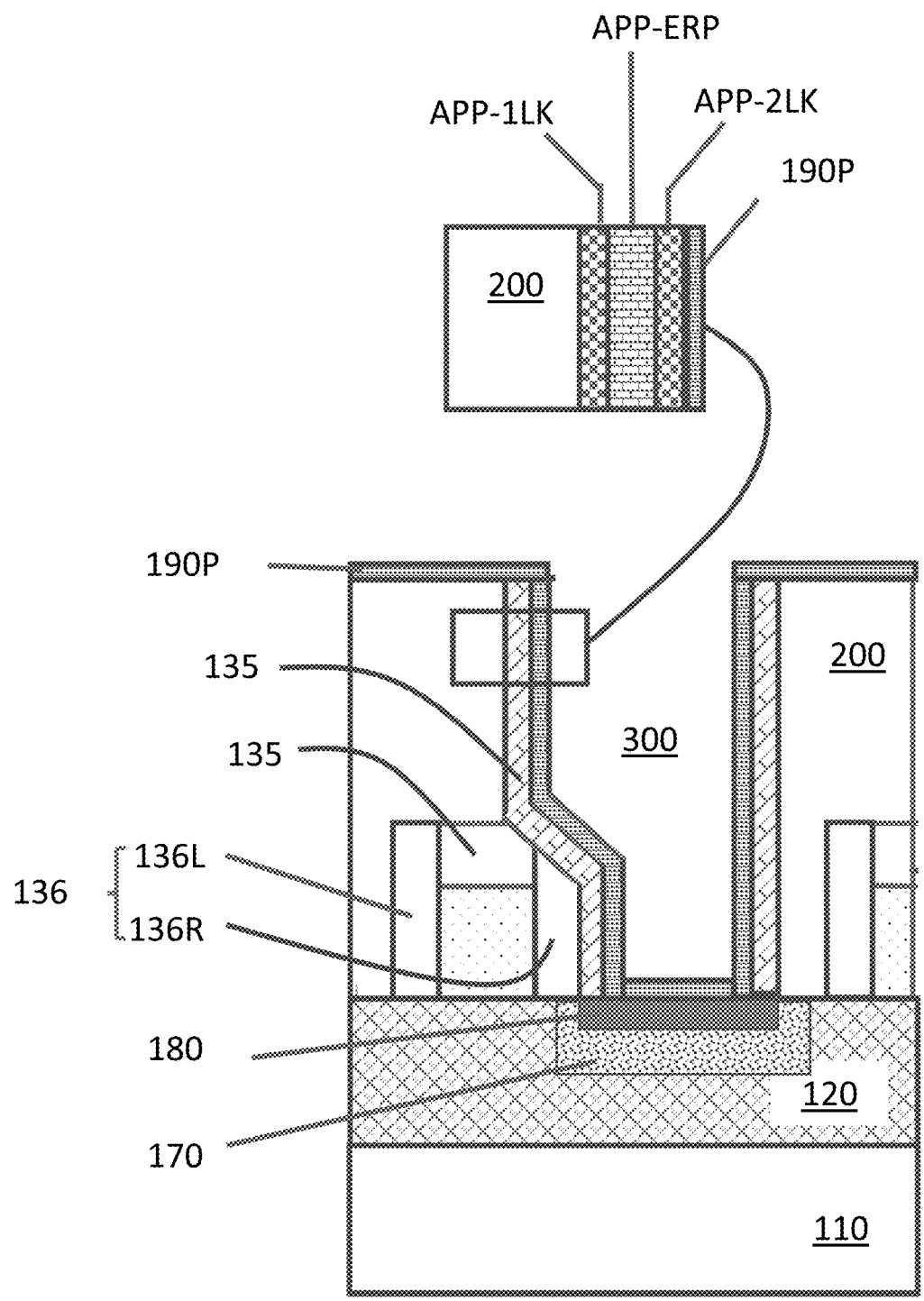

In FIG. 8E, a nitride liner layer 190P may be conformally formed on the resulting structure of FIG. 8D according to step S150 of FIG. 6. For example, the nitride liner layer 190P may be formed by using a plasma-enhance CVD (PECVD) process or an ALD process. The nitride liner layer 190P may include TiN that is conductive.

Figure 8F:
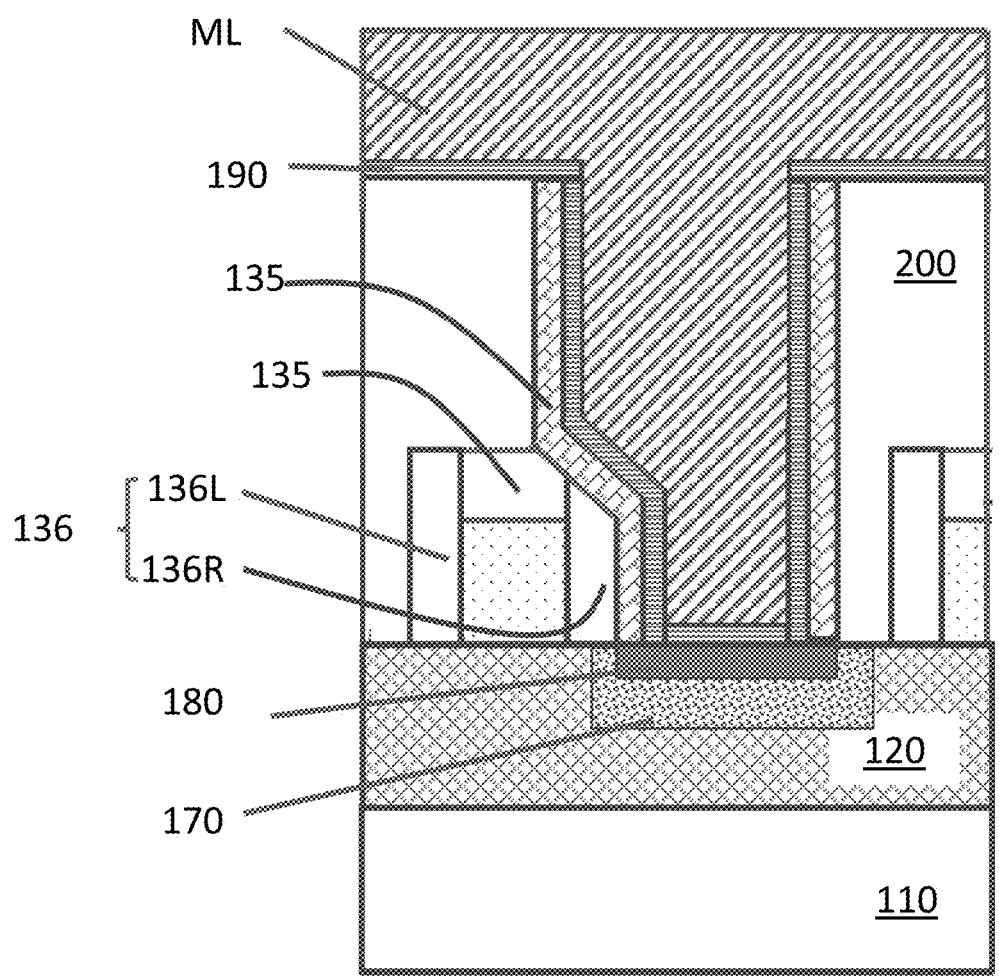

In FIG. 8F, a metal layer ML is formed, using a CVD process, on the resulting structure of FIG. 8E according to step S160 of FIG. 6. For example, the metal layer ML is formed on the nitride liner layer 190P, completely filling the trench 300 with the air pocket pattern APP. The metal layer ML may include metal such as tungsten (W), copper (Cu), cobalt (Co), ruthenium (Ru) or molybdenum (Mo).

Figure 8G:
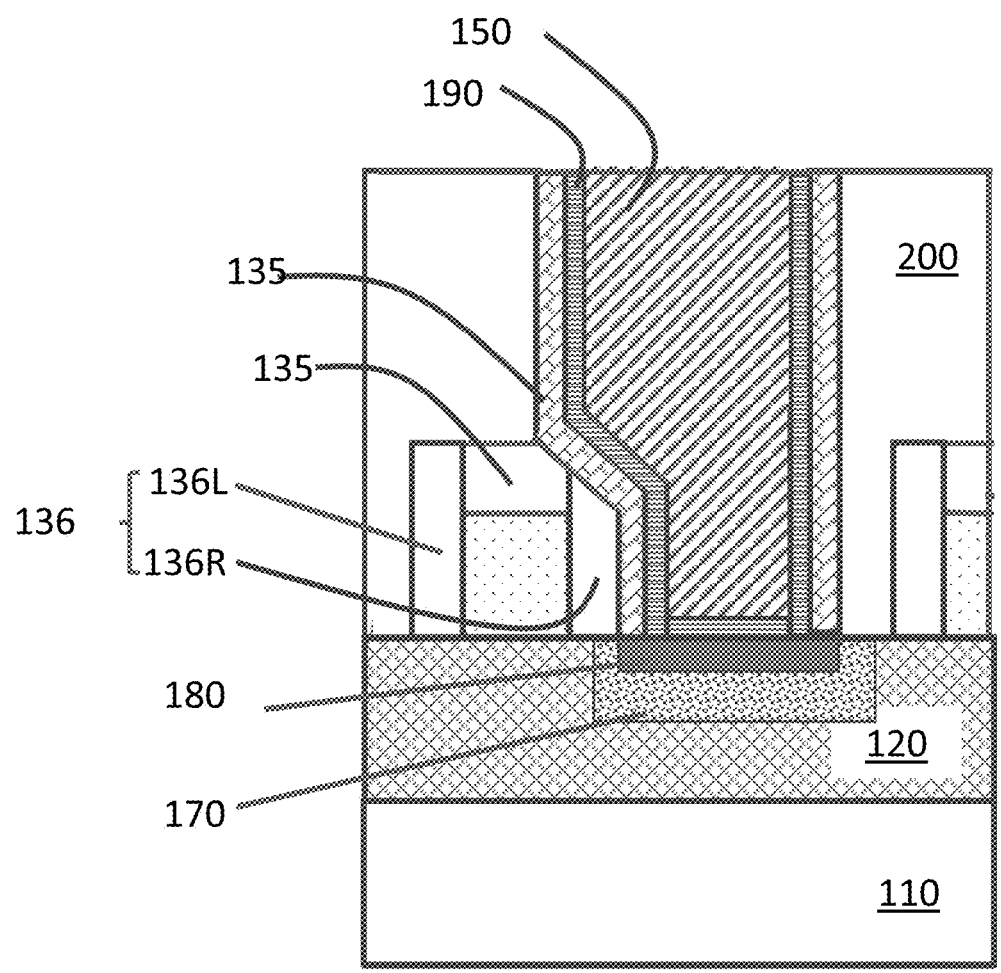

In FIG. 8G, a planarization process may be performed on the resulting structure of FIG. 8F according to step S170 of FIG. 6. For example, the metal layer ML and the nitride liner layer 190P may be planarized, thereby forming the nitride liner 190 from the nitride liner layer 190P and the second source/drain electrode 150 from the metal layer ML. The planarization process may include a chemical-mechanical-planarization (CMP) process or an etch-back process.

Figure 8H:
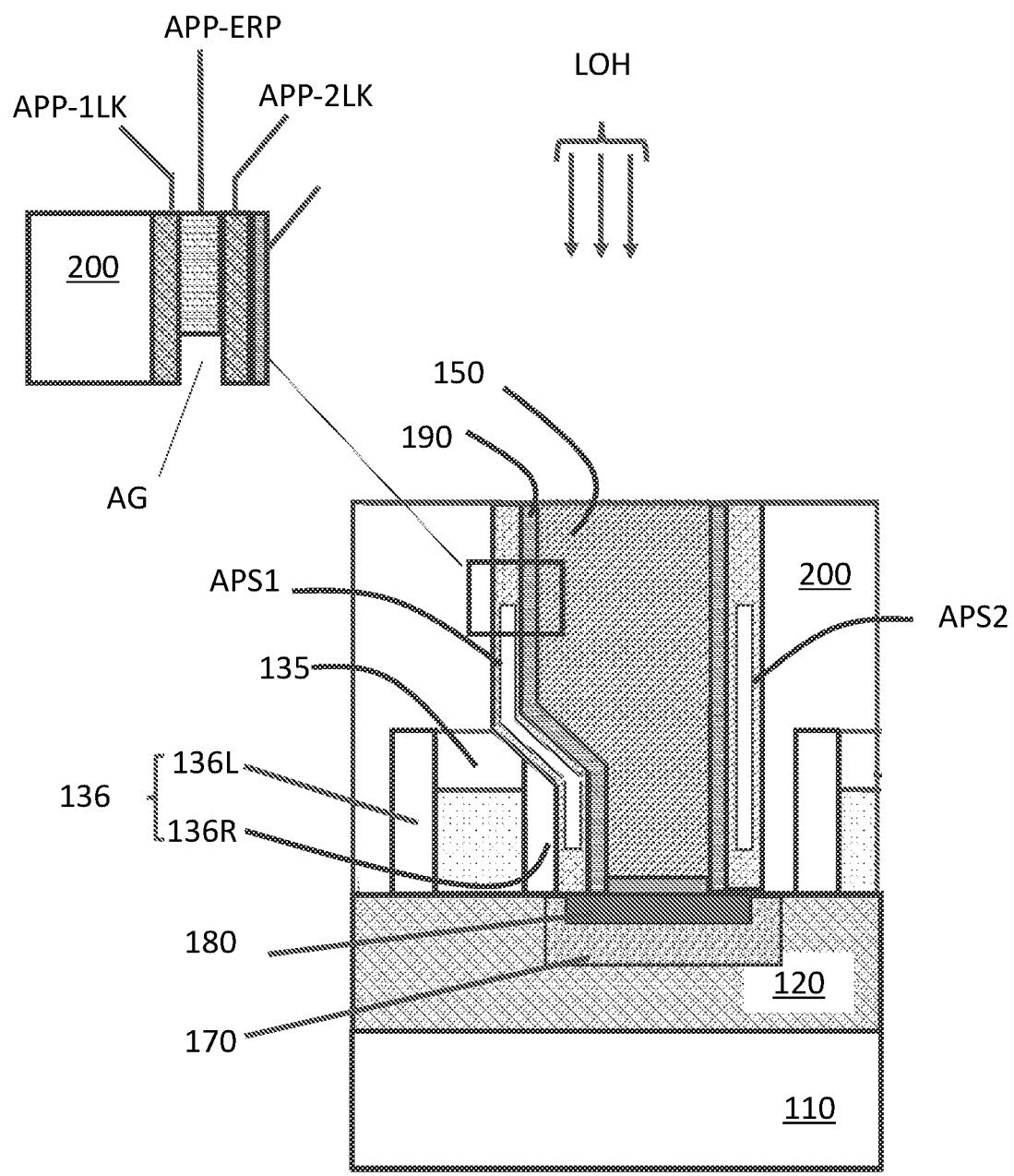

In FIG. 8H, a heat treatment process may be performed on the resulting structure of FIG. 8G according to step S180 of FIG. 6 to form the air pocket structure APS from the air pocket pattern APP. The detailed structure of the air pocket structure APS was given with reference to FIGS. 3A to 3C, and thus the repeated description will be omitted.

The heat treatment process may be performed at an annealing temperature between about 800 and about 900, for example, to form the air gap AG by removing a decomposable porogen material from the energy removable pattern APP-ERP. For example, the heat treatment process may apply a line of energy LOE on the structure of FIG. 8H, scanning through the structure with the line of energy LOE to deliver thermal energy to the energy removable pattern APP-ERP.

The present inventive concept is not limited thereto. For example, an ultra-violet (UV) light treatment process may apply.

In an exemplary embodiment, the air gap AG may be formed using a heat treatment process for the subsequent process step performed at an annealing temperature of about 800 to reduce the number of fabrication process steps. For example, the subsequent process steps may include a series of contact structures demanding an annealing process performed at an annealing temperature between about 800 and about 900. The present inventive concept is not limited thereto. For example, when a subsequent process is performed at a temperature higher than the annealing temperature, the heat treatment process for forming the air gap AG may be performed at the temperature higher than the annealing temperature between 800 and about 900.

According to an exemplary embodiment, an air pocket structure having an air gap may be formed between a gate spacer and a source/drain electrode to reduce a RC delay of the MOL integration including a source/drain contact.

According to an exemplary embodiment, the energy removable pattern may be formed after the formation of a gate spacer and before the formation of a source/drain electrode, and a heat treatment process may be performed on the energy removable pattern after the formation of the source/drain electrode. This fabrication sequence may allow a transistor to have an air gap within a trench.

Hereinafter, it will be described about a fabrication process of forming the semiconductor device 100 of FIG. 1 with the first air pocket structure APS1 of FIG. 4. The fabrication process will be described with reference to FIGS. 1, 4, 6, 8A, 8B, 8E-8H, 9, 10 and 11.

FIG. 6 is a flowchart showing fabrication process steps of forming the semiconductor device 100; FIG. 9 shows step S130 of FIG. 6 in detail according to an exemplary embodiment of the present inventive concept; and FIGS. 8A, 8B, 8E-8H, 10 and 11 show step-by-step, cross-sectional views, taken along line I-I' of FIG. 1, of the semiconductor device 100 formed according to the fabrication process of FIGS. 6 and 9.

Figure 10:
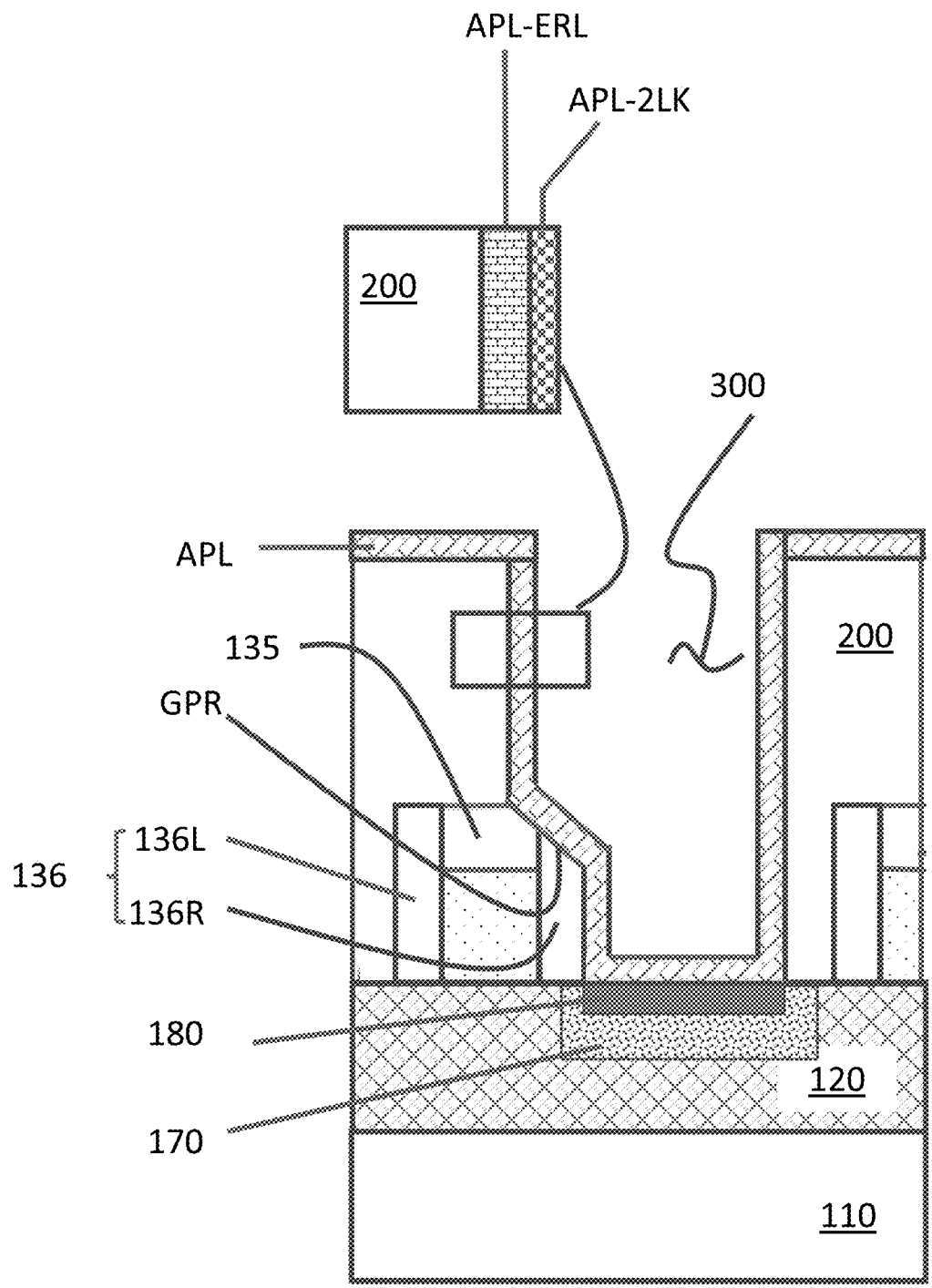
FIGS. 10 and 11 show step-by-step, cross-sectional views, taken along line I-I' of FIG. 1, of the semiconductor device of FIG. 1 formed using the fabrication process of FIGS. 6 and 9 according to an exemplary embodiment of the present inventive concept.

In FIG. 10, an air pocket layer APL is formed on the resulting structure of FIG. 8B according to step S130 of FIGS. 6 and 9. For example, the air pocket layer APL may be conformally formed, using a CVD process, on a top surface of the interlayer dielectric layer 200 and an inner sidewall of the trench 300. The inner sidewall of the trench 300 may be defined by a sidewall of the interlayer dielectric layer 200, the gate-spacer-loss region GPR and a sidewall of the second gate spacer 136R. In an exemplary embodiment, the air pocket layer APL may be in contact with the second gate spacer 136R with the gate-spacer-loss region GPR. In an exemplary embodiment, the air pocket layer APL may be in contact with the source/drain contact 180.

The air pocket layer APL includes a second low-k dielectric layer APL-2LK and an energy removable layer APL-ERL. In step S130B, the energy removable layer APL-ERL may be formed, using a CVD process, on the first low-k dielectric layer APL-1LK. In step S130C, the second low-k dielectric layer APL-2LK may be formed, using a CVD process, on the energy removable layer APL-ERL.

The second low-k dielectric layer APL-2LK may include a low-k dielectric material having atoms such as Si, C, O, N, B, P and H.

The energy removable layer APL-ERL may include a material such as a thermal decomposable material, a photonic decomposable material, an e-beam decomposable material, and a combination thereof. The detailed description of the material was made above with reference to the top sealing APS-TS, and thus the detailed description thereof will be omitted.

Figure 11:
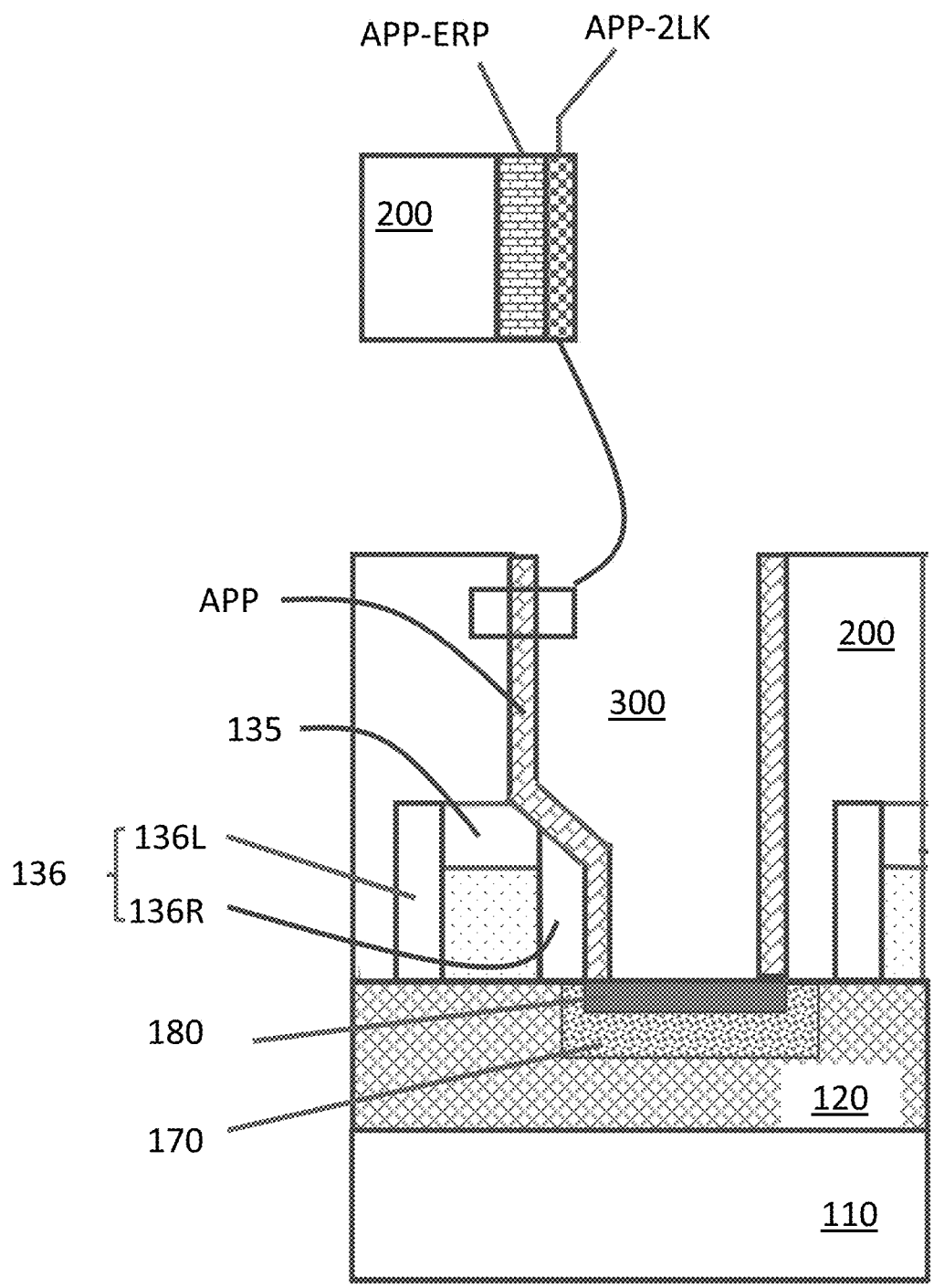

In FIG. 11, an air pocket pattern APP is formed from the air pocket layer APL of FIG. 10 according to step S140 of FIG. 6 using a reactive ion etching (ME) process. The detailed description is substantially the same as that of FIG. 8D, and thus will be omitted.

The air pocket pattern APP includes a second low-k dielectric pattern APP-2LK and an energy removable pattern APP-ERP. The second low-k dielectric pattern APP-2LK may remain in place in the subsequent process, thereby serving as a template with a sidewall of the second gate spacer 136R and a sidewall of the interlayer dielectric layer 200 to form the air gap AG. In the completed structure of the air pocket structure APP of FIG. 4, the second low-k dielectric pattern APP-2LK was referred to using "APS-2LK." The remaining process steps S150 to S180 will be performed to form the completed structure of the air pocket structure APP of FIG. 4.

Hereinafter, it will be described about a fabrication process of forming the semiconductor device 100 of FIG. 1 with the first air pocket structure APS1 of FIG. 5. The fabrication process will be described with reference to FIGS. 1, 4, 6, 8A, 8B, 8E to 8H, and 12 to 14.

Figure 12:
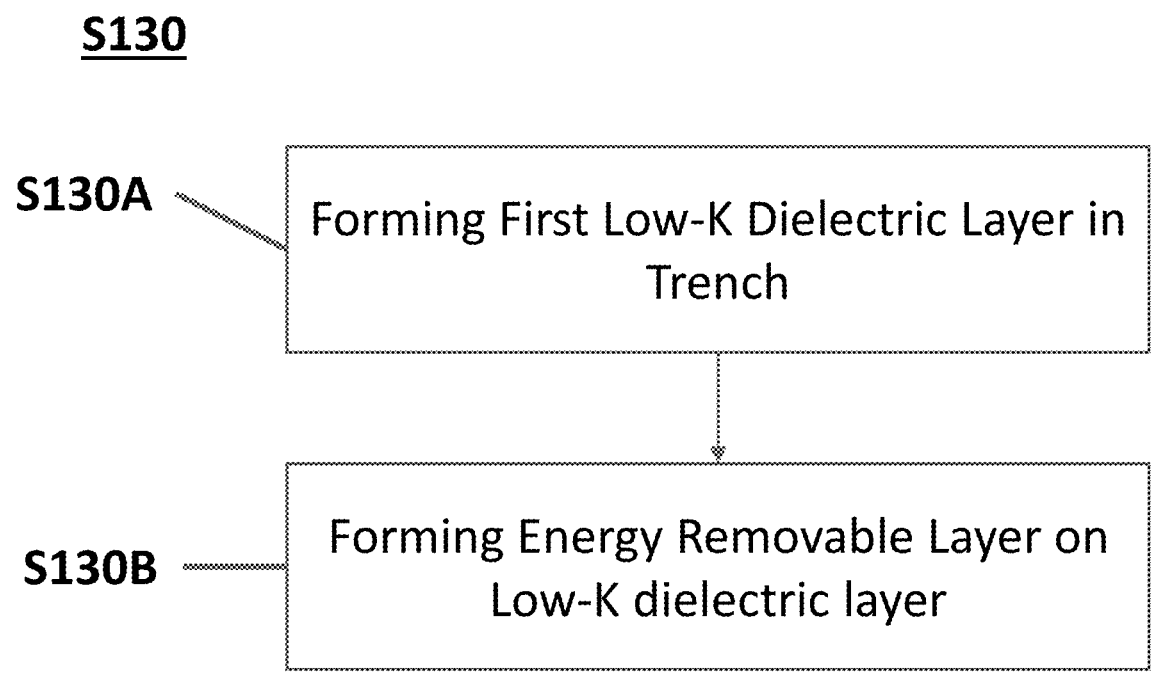
FIG. 12 shows step S130 of FIG. 6 in detail according to an exemplary embodiment of the present inventive concept.

FIG. 6 is a flowchart showing fabrication process steps of forming the semiconductor device 100; FIG. 12 shows step S130 of FIG. 6 in detail according to an exemplary embodiment of the present inventive concept; and FIGS. 8A, 8B, 8E-8H, 13 and 14 show step-by-step, cross-sectional views, taken along line I-I' of FIG. 1, of the semiconductor device 100 formed according to the fabrication process of FIGS. 6 and 12.

Figure 13:
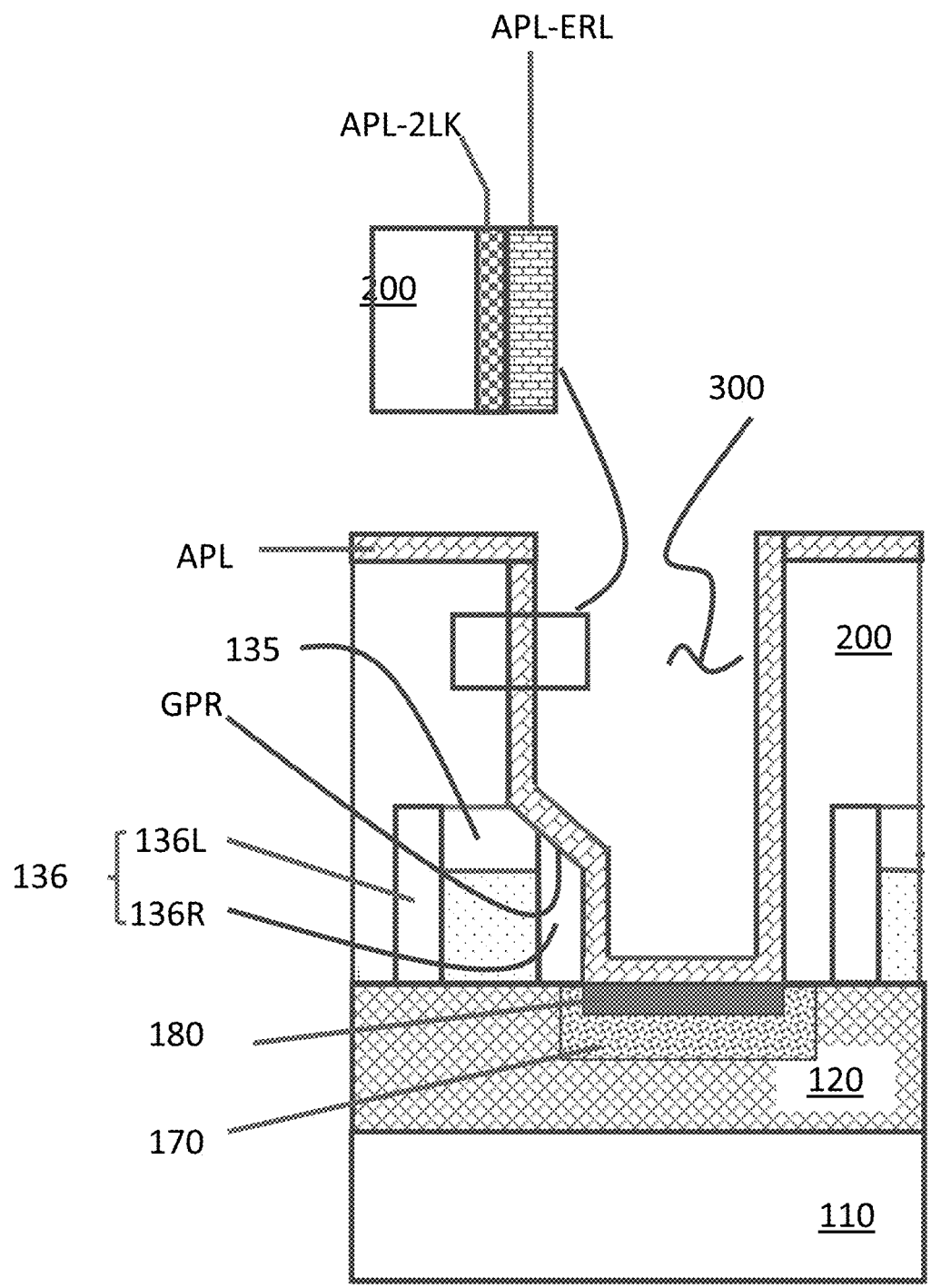
FIGS. 13 and 14 show step-by-step, cross-sectional views, taken along line I-I' of FIG. 1, of the semiconductor device of FIG. 1 formed using the fabrication process of FIGS. 6 and 12 according to an exemplary embodiment of the present inventive concept.

In FIG. 13, an air pocket layer APL is formed on the resulting structure of FIG. 8B according to step S130 of FIGS. 6 and 12. For example, the air pocket layer APL may be conformally formed, using a CVD process, on a top surface of the interlayer dielectric layer 200 and a sidewall of the trench 300. The sidewall of the trench 300 may be defined by a sidewall of the interlayer dielectric layer 200, the gate-spacer-loss region GPR and a sidewall of the second gate spacer 136R. In an exemplary embodiment, the air pocket layer APL may be in contact with the second gate spacer 136R with the gate-spacer-loss region GPR. In an exemplary embodiment, the air pocket layer APL may be in contact with the source/drain contact 180.

The air pocket layer APL includes a first low-k dielectric layer APL-1LK and an energy removable layer APL-ERL. In step S130A, the first low-k dielectric layer APL-1LK may be formed, using a CVD process, in the trench 300. In step S130B, the energy removable layer APL-ERL may be formed, using a CVD process, on the first low-k dielectric layer APL-1LK.

The first low-k dielectric layer APL-1LK may include a low-k dielectric material having atoms such as Si, C, O, B, P, N and H.

The energy removable layer APL-ERL may include a material such as a thermal decomposable material, a photonic decomposable material, an e-beam decomposable material, and a combination thereof. The detailed description of the material was made above with reference to the top sealing APS-TS, and thus the detailed description thereof will be omitted.

Figure 14:
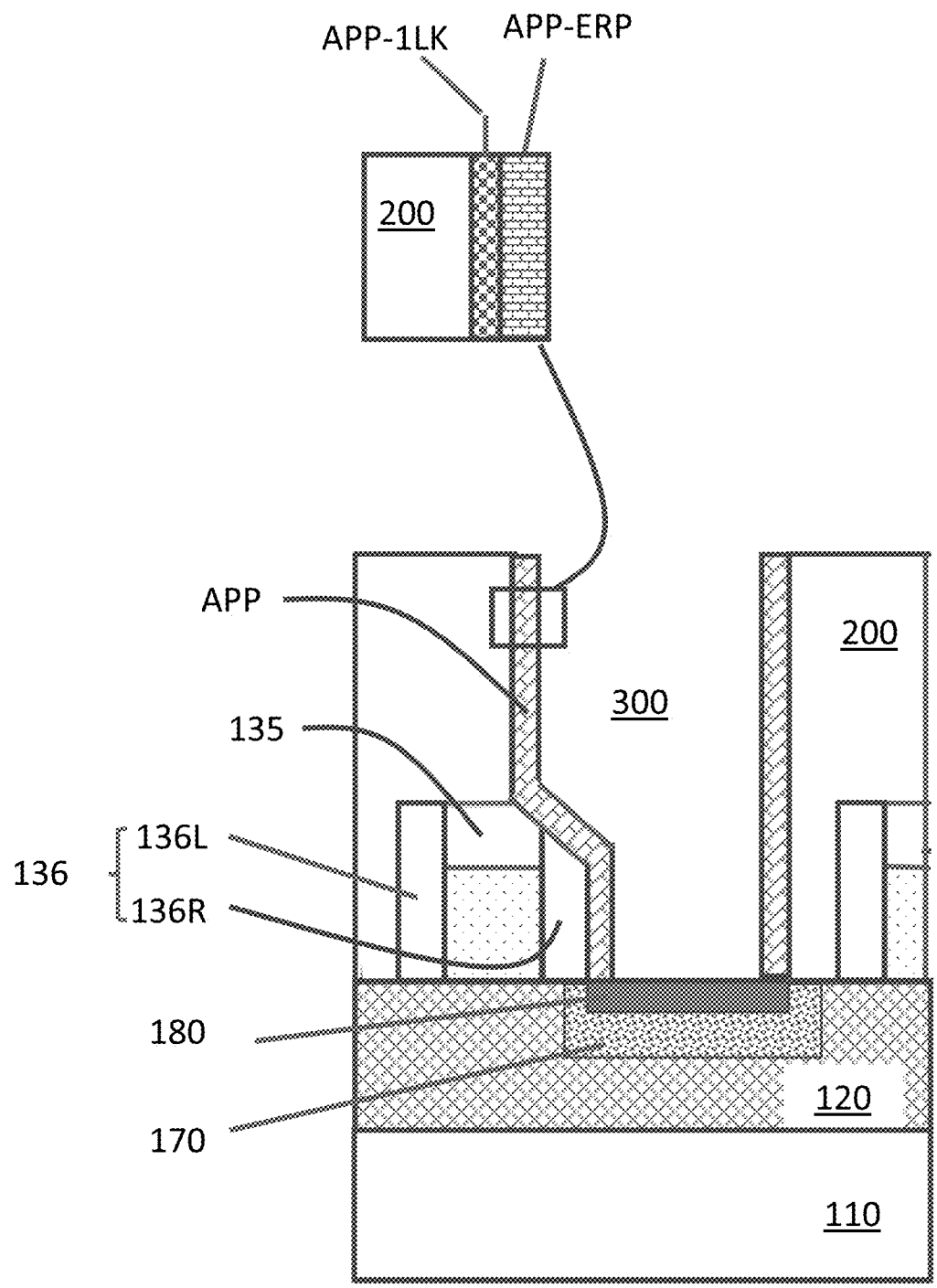

In FIG. 14, an air pocket pattern APP is formed from the air pocket layer APL of FIG. 13 according to step S140 of FIG. 6 using a reactive ion etching (RIE) process. The detailed description is substantially the same as that of FIG. 8D, and thus will be omitted.

The air pocket pattern APP includes a first low-k dielectric pattern APP-1LK and an energy removable pattern APP-ERP. The first low-k dielectric pattern APP-1LK may remain in place in the subsequent process, thereby serving as a template with a sidewall of the nitride liner 190 to form the air gap AG. In the completed structure of the air pocket structure APP of FIG. 5, the first low-k dielectric pattern APP-1LK was referred to using "APS-1LK." The remaining process steps S150 to S180 will be performed to form the completed structure of the air pocket structure APP of FIG. 4.

Figure 15:
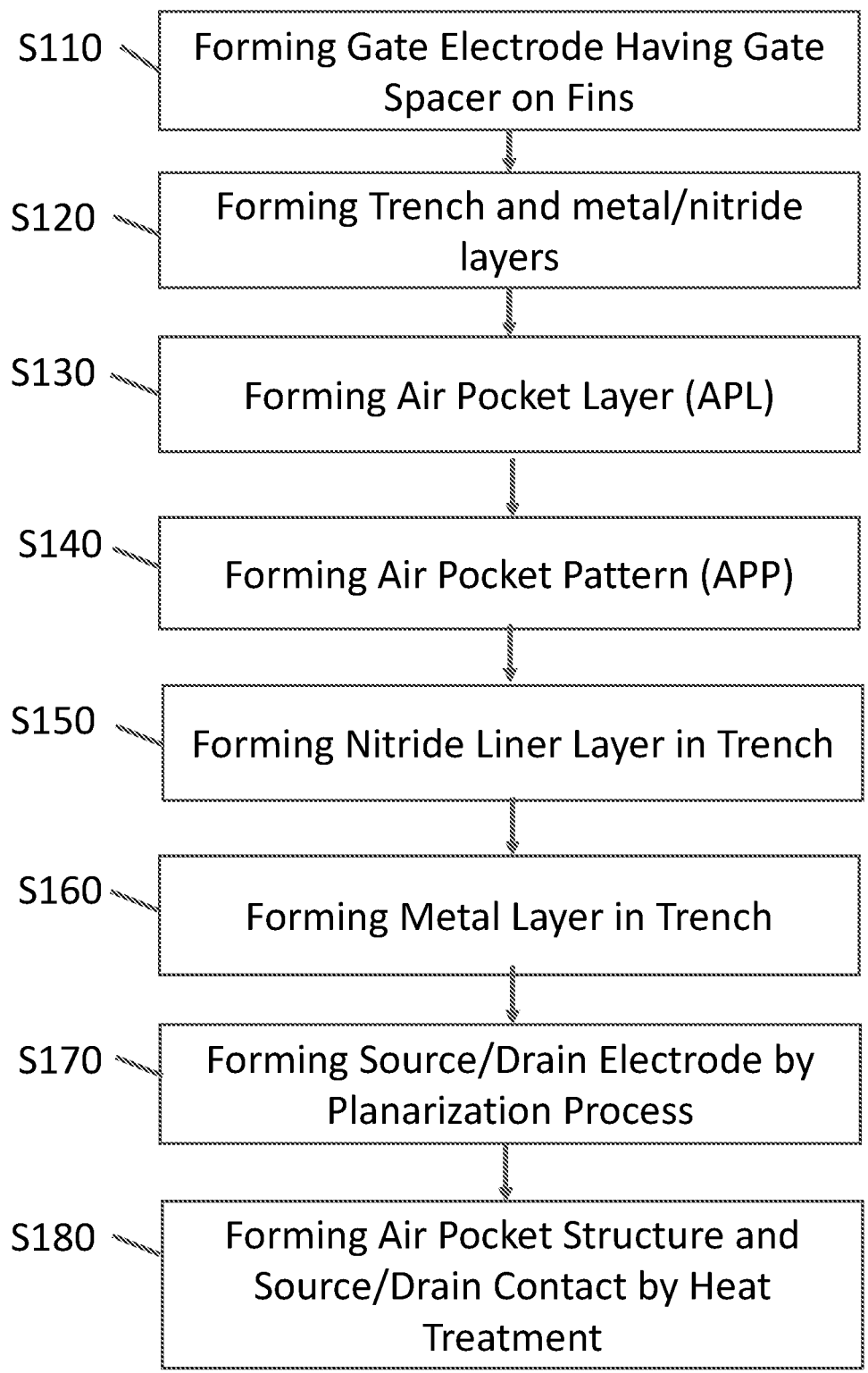
FIG. 15 is a flowchart showing fabrication process steps of forming the semiconductor device of FIG. 1 according to an exemplary embodiment of the present inventive concept.

Hereinafter, with reference to FIG. 15, it will be described about a fabrication process of forming the semiconductor device 100 of FIG. 1 with the first air pocket structure APS1 of FIG. 5. The fabrication process of FIG. 15 is substantially the same as that of FIG. 6, except that the heat treatment process of S120 in FIG. 6 is performed after the second source/drain electrode 150 is formed. In this case, the source/drain contact 180 and the air gap AG may be formed at substantially the same time with a heat treatment process that may be performed in the process steps for forming a series of contact structures demanding an annealing process performed at a temperature between about 800 and about 900. For example, in step S120', a dual layer including a metal layer and a nitride layer may be formed on the source/drain region 170 exposed by the trench 300 without performing a heat treatment process. The heat treatment process will be held in abeyance until the second source/drain electrode 150 is formed in step S170 and then the heat treatment process is applied to form simultaneously the source/drain contact 180 in the source/drain region 170 and the air gap AG, as shown in FIG. 8H.

Hereinafter, it will be described about a fabrication process of forming the semiconductor device 100 of FIG. 1 with the first air pocket structure APS1 of FIG. 3A to 3C. The fabrication process will be described with reference to FIGS. 1, 16 and 17A to 17F.

Figure 16:
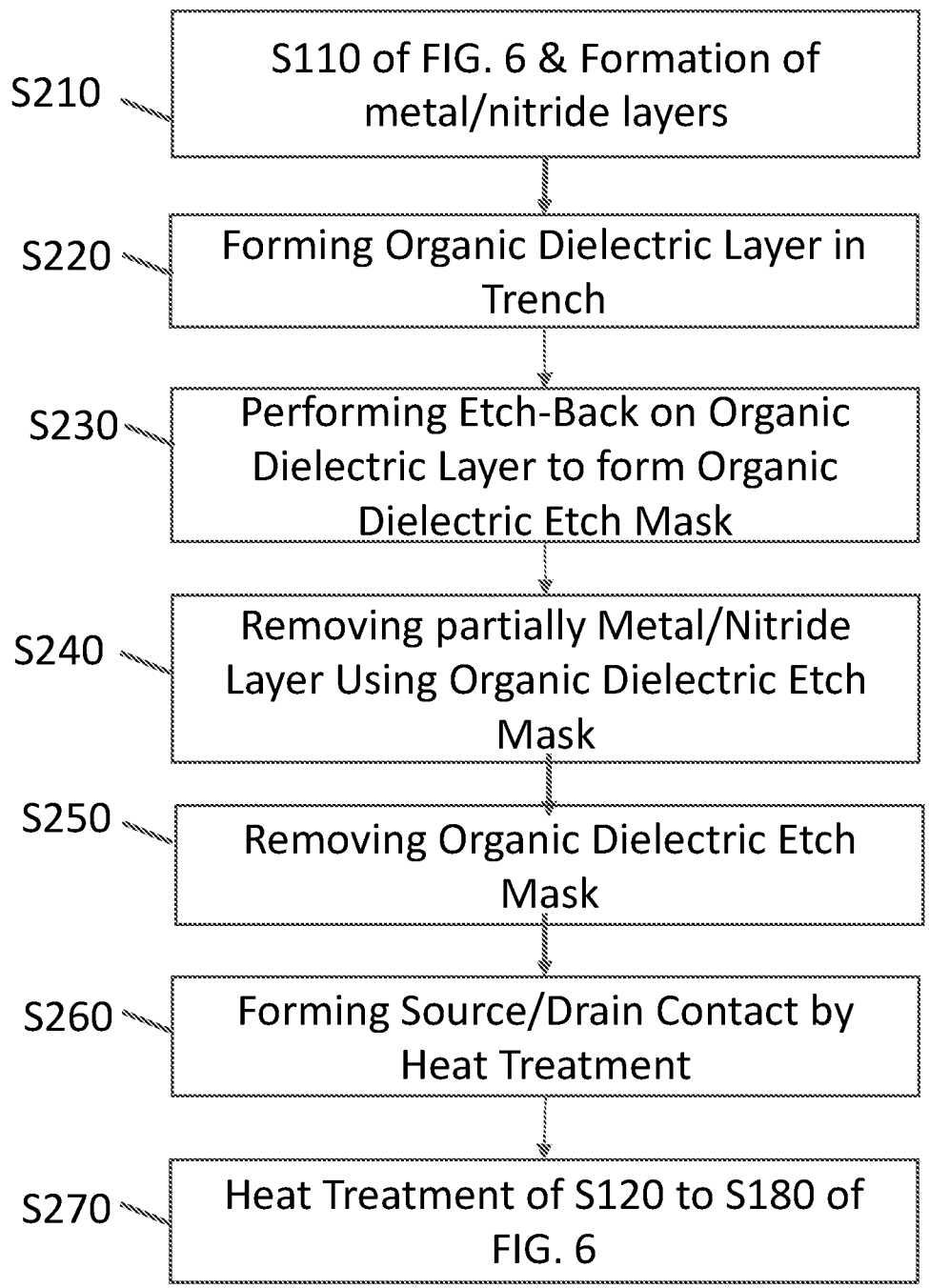
FIG. 16 is a flowchart showing fabrication process steps of forming the semiconductor device of FIG. 1 according to an exemplary embodiment of the present inventive concept.

FIG. 16 is a flowchart showing fabrication process steps of forming the semiconductor device 100; and FIGS. 17A to 17F show step-by-step, cross-sectional views taken along line I-I' of FIG. 1 of the semiconductor device 100 formed according to the fabrication process of FIG. 16. The fabrication process steps of FIG. 16 are substantially similar to those of FIG. 6, except that a dual layer of a metal layer and a nitride layer is partially removed from a sidewall of the trench 300 before a heat treatment process is applied to form the source/drain contact 180.

Figure 17A:
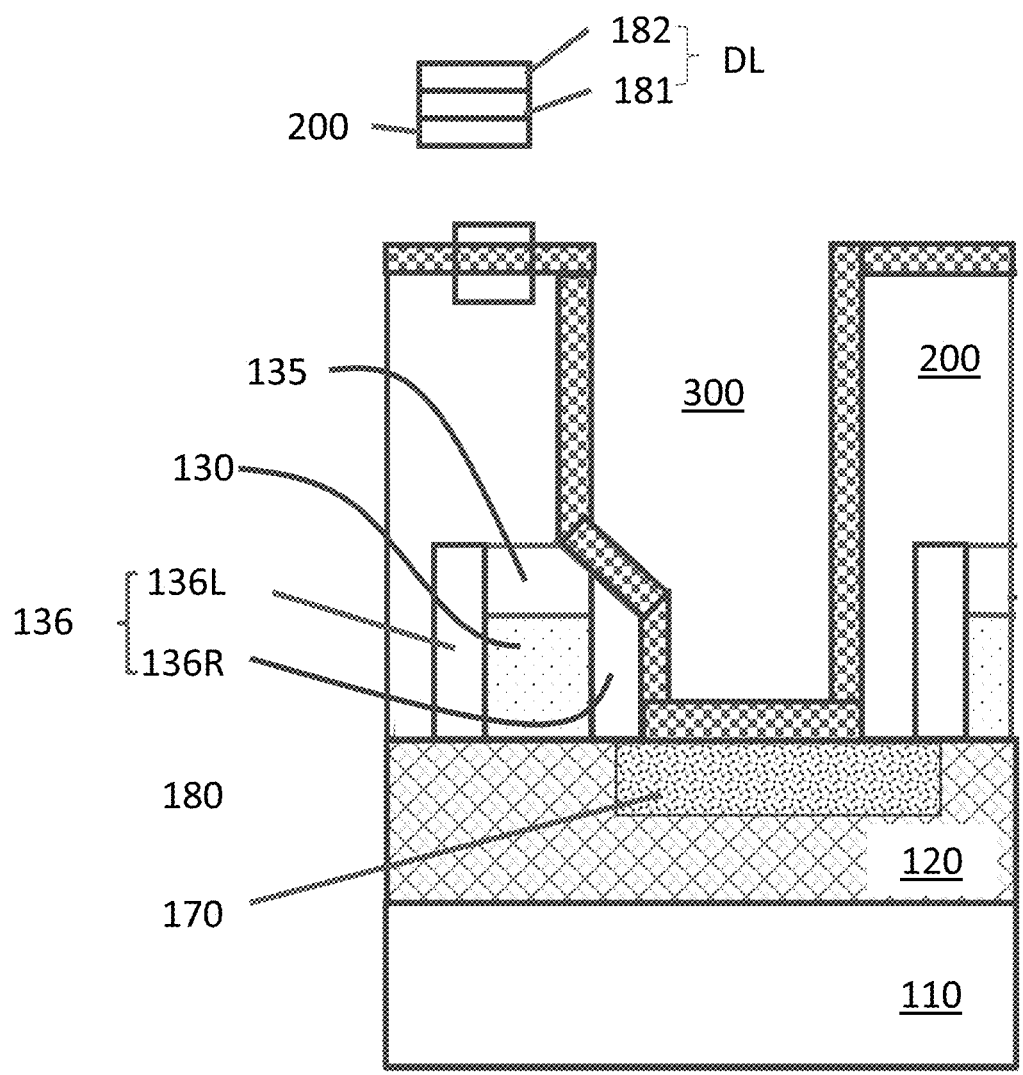
FIGS. 17A, 17B, 17C, 17D, 17E and 17F show step-by-step, cross-sectional views, taken along line I-I' of FIG. 1, of the semiconductor device formed by using the exemplary fabrication process steps of FIG. 16 according to the present inventive concept.

In FIG. 17A, a dual layer DL including a metal layer 181 and a nitride layer 182 are formed on the source/drain region 187 according to step 210 of FIG. 16. The step 210 includes the step S110 of FIG. 6 and the formation of the dual layer DL. For example, the metal layer 181 may be formed on the source/drain region 187 using a sputtering process; and the nitride layer 182 may be conformally formed on the metal layer 181 using a CVD process or an ALD process. At the bottom of the trench 300, the metal layer 181 may be in contact with the source/drain region 187 and may be interposed between the source/drain region 187 and the nitride layer 182. For example, the metal layer 181 may include titanium, nickel, nickel platinum, aluminum, molybdenum or cobalt; and the nitride layer 182 may include TiN or TaN.

Figure 17B:
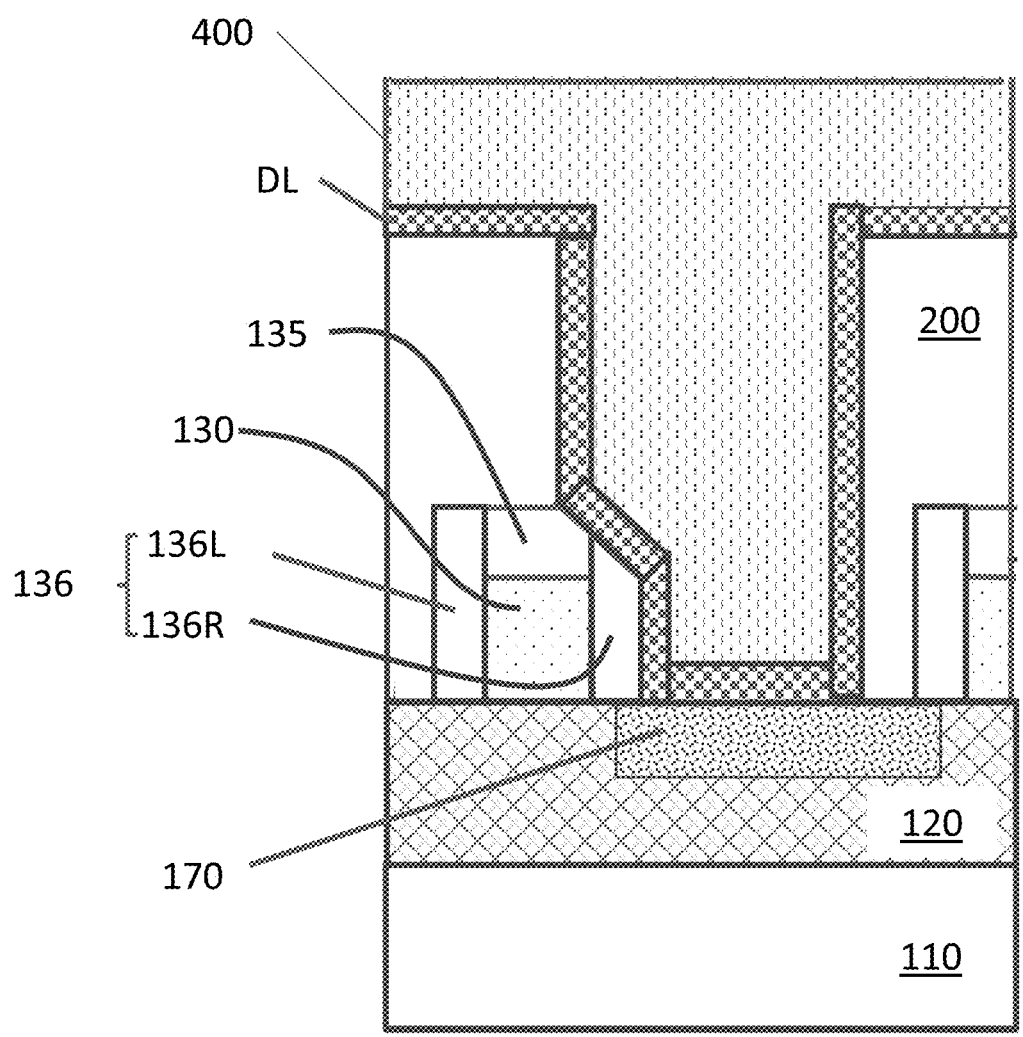
Figure 17C:
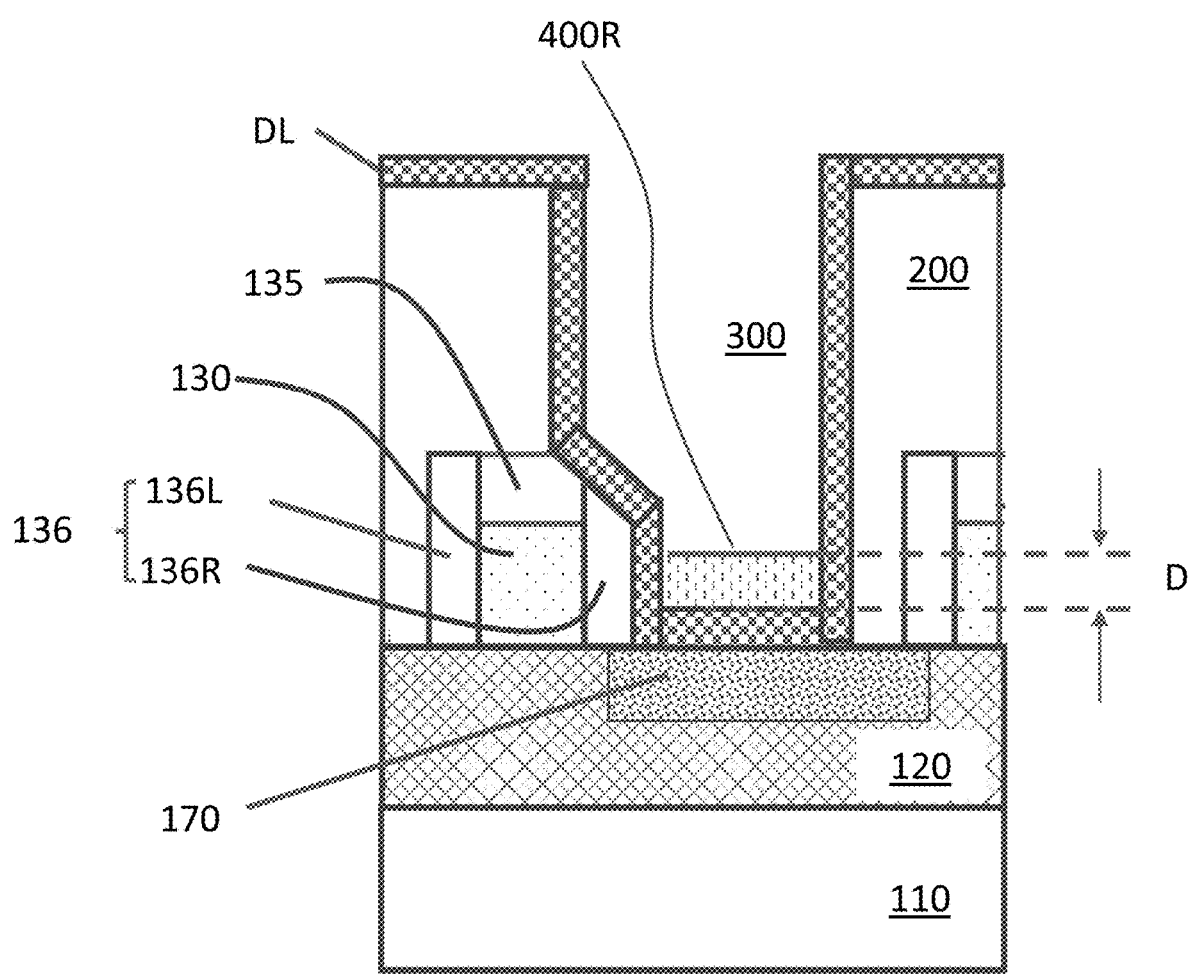

In FIG. 17B, an organic dielectric layer 400 are formed on the resulting structure of FIG. 17A according to step S220 of FIG. 16. For example, the organic dielectric layer 400 fills the trench 300. The organic dielectric layer 400 may include, but are not limited to, Poly(arylene)ethers, Poly(arylene) ether oxazoles, Parylene-N, Polyimides, Polynaphthalene-N, Polyphenyl-Quinoxalines, Polybenzoxazoles, Polyindane, Polynorborene, Polystyrene, Polyphenyleneoxide, Polyethylene, Polypropylene, divinylsiloxane bis-benzocyclobutene (BCB), αC, αFC, or combinations thereof In FIG. 17C, an etch-back process is performed on the resulting structure of FIG. 17B to form an organic-dielectric-etch mask 400R according to step S230 of FIG. 16. For example, in the etch-back process, a top surface of the organic dielectric layer 400 may be recessed to form the organic-dielectric-etch mask 400R. The organic-dielectric-etch mask 400R has a predetermined thickness D sufficient to form the source/drain contact in a heat treatment process that will be described with reference to step S260.

Figure 17D:
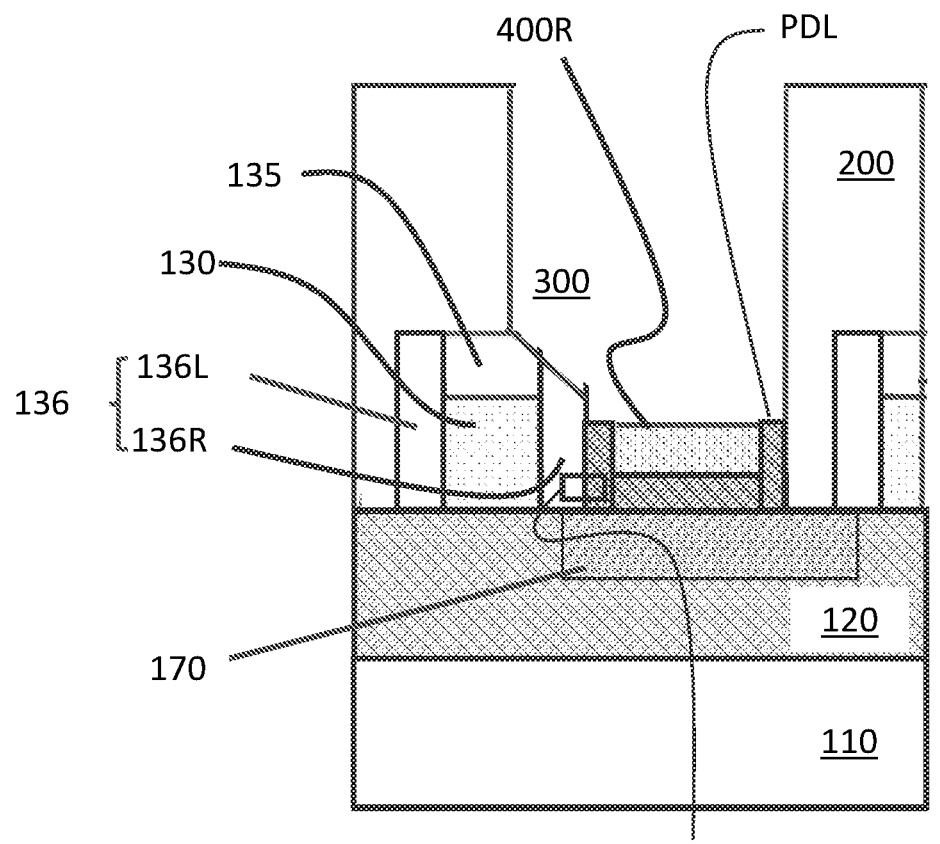
Figure 17D:
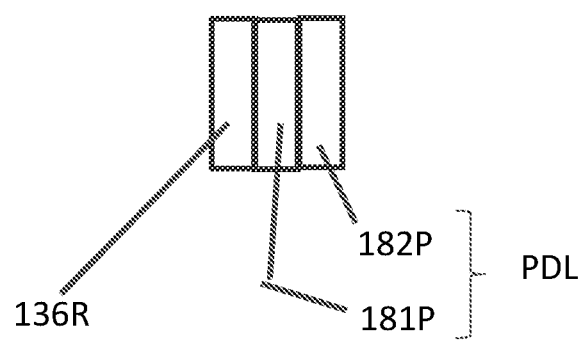

In FIG. 17D, the dual layer DL is partially removed using the organic-dielectric-etch mask 400R according to step S240 of FIG. 16. An etching process using an etchant such as $H_2O_2$ and a SC-1 solution may be applied to the resulting structure of FIG. 17C. The dual layer DL not covered with the organic-dielectric-etch mask 400R may be removed, thereby forming a patterned dual layer PDL at the bottom of the trench 300. The patterned dual layer PDL includes a patterned metal layer 181P and a patterned nitride layer 182P.

Figure 17E:
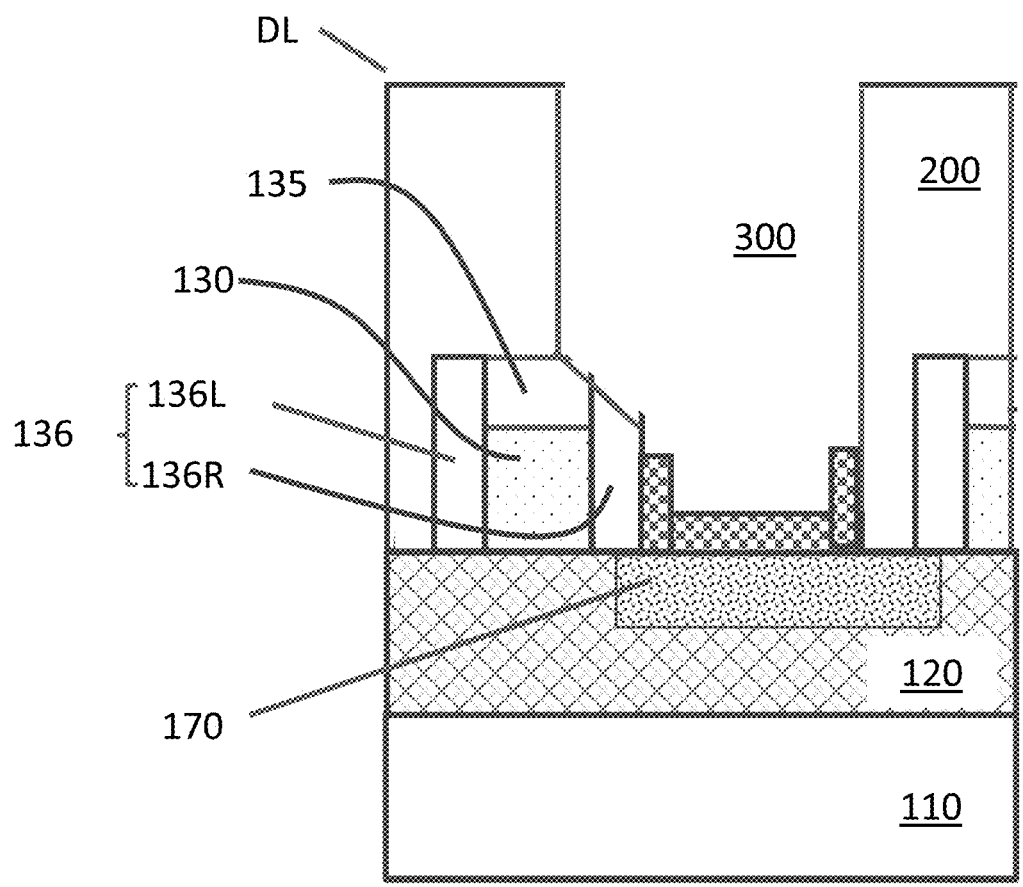
Figure 17F:
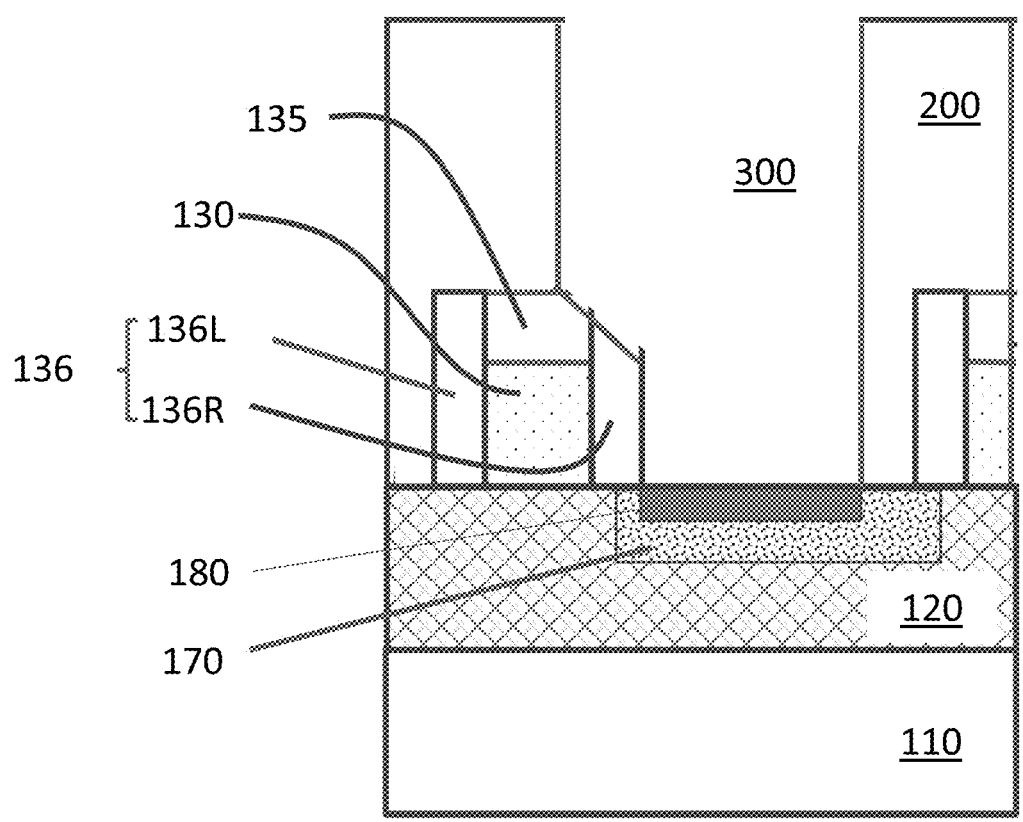

In FIG. 17E, the organic-dielectric-etch mask 400R is removed according to step S250 of FIG. 16 and then a heat treatment process may be applied according to steps S250 and S260. In an exemplary embodiment, the organic-dielectric-etch mask 400R may be removed using an ashing process. The heat treatment process may be performed in a temperature between about 800 and about 900, for example, to form the source/drain contact 180. The present inventive concept is not limited thereto. For example, an ultra-violet (UV) light treatment process may apply. In an exemplary embodiment, before performing the subsequent process, unreacted part of the patterned metal layer 181P and the patterned nitride layer 182P may be removed by using an etchant such as $H_2O_2$ and a SC-1 solution. The resulting structure of FIG. 17F corresponds to that of FIG. 8B. The process steps of the heat treatment of S120 to S180 applicable to the resulting structure of FIG. 8B will apply to the resulting structure of FIG. 17F according to step S270 of FIG. 16.

Figure 18:
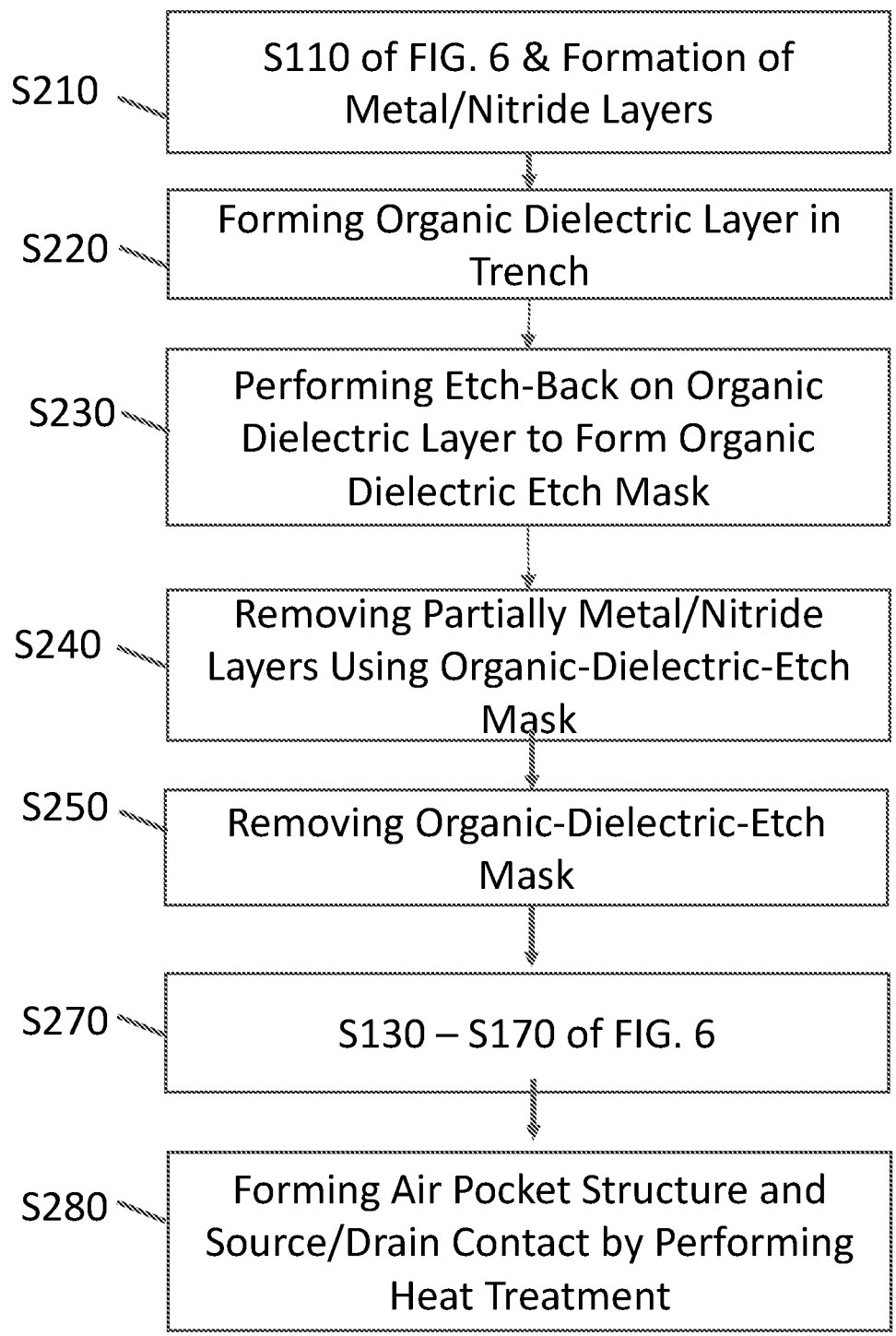
FIG. 18 is a flowchart showing fabrication process steps of forming the semiconductor device of FIG. 1 according to an exemplary embodiment of the present inventive concept.

Hereinafter, with reference to FIG. 18, it will be described about a fabrication process of forming the semiconductor device 100 of FIG. 1 with the first air pocket structure APS1 of FIG. 5. The fabrication process of FIG. 18 is substantially the same as that of FIG. 16 except that the heat treatment of S120 in FIG. 16 is performed after the second source/drain electrode 150 is formed. In this case, the source/drain contact 180 and the air gap AG may be formed at substantially the same time with a heat treatment for the process steps for forming a series of contact structures demanding an annealing process performed at an annealing temperature between about 800 and about 900. The present inventive concept is not limited thereto. For example, when a process step is performed at a temperature higher than the annealing temperature, the process step may be used to form the source/drain contact 180 and the air gap AG simultaneously. The forming of the series of contact structures may be performed after the second source/drain electrode 150 is formed.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
    forming a gate structure on a fin, wherein the gate structure includes a first gate spacer, a second gate spacer, and a gate electrode interposed therebetween;
    forming a source/drain contact on the fin;
    forming a source/drain electrode on the source/drain contact;
    forming an air pocket pattern on the source/drain contact, wherein the air pocket pattern includes a first low-k dielectric pattern and an energy removable pattern between the gate structure and the source/drain electrode; and
    forming an air gap defined in part by the first low-k dielectric pattern by applying energy to the energy removable pattern,
    wherein the forming of the source/drain electrode includes:
        forming an interlayer dielectric layer covering the gate structure and the fin;
        forming a trench exposing a part of the fin;
        forming a source/drain region in the part of the fin through the trench;
        forming the source/drain contact on the source/drain region, and
    wherein the forming of the source/drain contact includes:
        forming a metal layer within the trench;
        forming a nitride layer on the metal layer;
        forming an etch mask covering a bottom portion of the nitride layer; and
        removing partially the metal layer and the nitride layer exposed by the etch mask to form a patterned metal layer and a patterned nitride layer.

2. The method of claim 1,
    wherein the forming of the air gap includes separating the energy removable pattern into a top sealing and a bottom sealing,
    wherein the bottom sealing is in contact with the source/drain contact, and
    wherein the air gap is interposed between the bottom sealing and the top sealing.

3. The method of claim 1,
    wherein the forming of the source/drain contact further includes a silicidation process, and wherein the silicidation process is performed by the applying of the energy to the energy removable pattern.

4. The method of claim 1,
    wherein the forming of the air pocket pattern is before the forming of the source/drain electrode, and
    wherein the applying of the energy to the energy removable pattern is performed after the forming of the source/drain electrode.

5. The method of claim 1,
    wherein the air pocket pattern further includes a second low-k dielectric pattern, and
    wherein the energy removable pattern is interposed between the first low-k dielectric pattern and the second low-k dielectric pattern.

6. The method of claim 1, further comprising:
    forming a nitride liner between the air pocket pattern and the source/drain electrode.

7. The method of claim 6,
    wherein the air pocket pattern further includes a second low-k dielectric pattern,
    wherein the energy removable pattern is interposed between the first low-k dielectric pattern and the second low-k dielectric pattern, and
    wherein the second low-k dielectric pattern is interposed between the energy removable pattern and the nitride liner,
    wherein the first low-k dielectric pattern is in contact with the second gate spacer,
    wherein the second low-k dielectric pattern is in contact with the nitride liner, and
    wherein the first low-k dielectric pattern and the second low-k dielectric pattern are in contact with the source/drain contact.

8. The method of claim 1,
    wherein the forming of the source/drain contact further includes:
    performing a silicidation process on the patterned metal layer.

9. The method of claim 8,
    wherein the silicidation process and the forming of the air gap are performed at the same time.

10. The method of claim 1,
    wherein the forming of the etch mask includes:
    forming an organic dielectric layer to fill the trench; and
    performing an etch-back process on the organic dielectric layer to form the etch mask.

11. A method of forming a trench silicide contact, the method comprising:
    perforating one or more layers to create a perforation exposing at least a portion of a silicon substrate;
    depositing a first material through the perforation, the first material including a first metal that is reactive with silicon;
    annealing the silicon substrate to form a silicide in the exposed portion of the silicon substrate;
    removing the first material from sidewalls of the layers;
    depositing a liner material onto the sidewalls of the layers, the liner material having a lower dielectric constant than that of silicon dioxide and including an energy removal porous material;

depositing a second material through the perforation, the deposited second material being in electrical contact with the silicide;

forming an etch mask covering a bottom portion of the deposited second material; and removing partially the liner material and the deposited second material exposed by the etch mask to form a patterned layer of the first material and a patterned layer of the liner material.

* * * * *